US012787710B2

(12) United States Patent
Nakamura et al.

(10) Patent No.: US 12,787,710 B2
(45) Date of Patent: Nov. 3, 2026

(54) SUBSTRATE PROCESSING DEVICE AND SUBSTRATE PROCESSING METHOD

(71) Applicant: SCREEN HOLDINGS CO., LTD., Kyoto (JP)

(72) Inventors: Kazuki Nakamura, Kyoto (JP); Yoshifumi Okada, Kyoto (JP); Nobuaki Okita, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 239 days.

(21) Appl. No.: 18/391,366

(22) Filed: Dec. 20, 2023

(65) Prior Publication Data

US 2024/0207900 A1 Jun. 27, 2024

(30) Foreign Application Priority Data

Dec. 23, 2022 (JP) ................................ 2022-207537
Dec. 27, 2022 (JP) ................................ 2022-210810
(Continued)

(51) Int. Cl.
*B08B 1/12* (2024.01)
*A46B 13/00* (2006.01)
(Continued)

(52) U.S. Cl.
CPC ........ *H10P 72/7611* (2026.01); *A46B 13/008* (2013.01); *A46B 13/02* (2013.01);
(Continued)

(58) Field of Classification Search
CPC .. H10P 72/7611; H10P 70/20; H10P 72/0412; H10P 72/0414; H10P 72/0604;
(Continued)

(56) References Cited

U.S. PATENT DOCUMENTS

| | | | | |
|---|---|---|---|---|
| 5,685,039 A | 11/1997 | Hamada et al. | ............... | 15/88.2 |
| 2002/0006876 A1 | 1/2002 | Hongo et al. | ................. | 505/191 |

(Continued)

FOREIGN PATENT DOCUMENTS

| | | |
|---|---|---|
| CN | 114203583 A | 3/2022 |
| CN | 114203587 A | 3/2022 |

(Continued)

OTHER PUBLICATIONS

U.S. Appl. No. 18/391,186, filed Dec. 20, 2023 by Yoshifumi Okada et al. entitled "Substrate Processing Device and Substrate Processing Method".

(Continued)

*Primary Examiner* — Alexander Markoff
(74) *Attorney, Agent, or Firm* — OSTROLENK FABER LLP

(57) ABSTRACT

A substrate processing device includes a plurality of cleaning devices and a main robot. The main robot is configured to carry a substrate into and carrying the substrate out from each substrate cleaning device. The substrate cleaning device includes a processing chamber. In the processing chamber, a brush cleaner that brings a brush into contact with a lower surface of the substrate to clean the lower surface of the substrate is provided. Further, the substrate cleaning device has a cleaning nozzle that discharges a brush cleaning liquid to the brush. In a period during which the substrate carry-in operation and the substrate carry-out operation are performed with respect to the substrate cleaning device by a main robot, supply of the brush cleaning liquid to the cleaning nozzle is stopped.

2 Claims, 21 Drawing Sheets

(30) Foreign Application Priority Data

Jan. 19, 2023 (JP) ................................ 2023-006892
Jan. 20, 2023 (JP) ................................ 2023-007649

(51) Int. Cl.

| | |
|---|---|
| ***A46B 13/02*** | (2006.01) |
| ***B08B 1/20*** | (2024.01) |
| ***B08B 1/36*** | (2024.01) |
| ***B08B 3/02*** | (2006.01) |
| ***B08B 3/04*** | (2006.01) |
| ***B08B 13/00*** | (2006.01) |
| ***H01L 21/67*** | (2006.01) |
| ***H10P 70/00*** | (2026.01) |
| ***H10P 72/00*** | (2026.01) |
| ***H10P 72/76*** | (2026.01) |

(52) U.S. Cl.

CPC .................. *B08B 1/12* (2024.01); *B08B 1/20* (2024.01); *B08B 1/36* (2024.01); *B08B 3/022* (2013.01); *B08B 3/041* (2013.01); *B08B 13/00* (2013.01); *H10P 70/20* (2026.01); *H10P 72/0412* (2026.01); *H10P 72/0414* (2026.01); *H10P 72/0604* (2026.01); *H10P 72/7602* (2026.01); *H10P 72/7612* (2026.01); *A46B 2200/3073* (2013.01); *B08B 2203/02* (2013.01)

(58) Field of Classification Search

CPC ............. H10P 72/7602; H10P 72/7612; H10P 72/7608; H10P 72/78; H10P 70/56; H10P 70/60; H10P 72/3302; A46B 13/008; A46B 13/02; A46B 2200/3073; B08B 1/12; B08B 1/20; B08B 1/36; B08B 3/022; B08B 3/041; B08B 13/00; B08B 2203/02; B08B 1/52

See application file for complete search history.

(56) References Cited

U.S. PATENT DOCUMENTS

| | | | | |
|---|---|---|---|---|
| 2002/0157692 | A1 | 10/2002 | Ishihara et al. | |
| 2005/0087441 | A1 | 4/2005 | Hongo et al. | 204/297.06 |
| 2005/0183754 | A1 | 8/2005 | Kago et al. | 134/56 R |
| 2007/0078552 | A1 | 4/2007 | Rosenberg | 700/94 |
| 2007/0113977 | A1 | 5/2007 | Hongo et al. | 156/345.31 |
| 2009/0026068 | A1 | 1/2009 | Hongo et al. | 204/199 |
| 2009/0199869 | A1 | 8/2009 | Kago et al. | 134/6 |
| 2009/0202951 | A1 | 8/2009 | Yamamoto et al. | 430/322 |
| 2014/0352608 | A1 | 12/2014 | Ishibashi | 118/52 |
| 2014/0352736 | A1 | 12/2014 | Yamamoto et al. | 134/26 |
| 2015/0027492 | A1 | 1/2015 | Takiguchi et al. | |
| 2015/0318193 | A1 | 11/2015 | Fukuda et al. | |
| 2016/0236239 | A1 | 8/2016 | Nishiyama | |
| 2018/0071883 | A1* | 3/2018 | Murachi | B24B 29/02 |
| 2018/0071884 | A1 | 3/2018 | Murachi et al. | |
| 2019/0164749 | A1 | 5/2019 | Kajita et al. | |
| 2020/0312678 | A1 | 10/2020 | Morikawa et al. | |
| 2022/0005736 | A1 | 1/2022 | Naohara et al. | |
| 2022/0088793 | A1* | 3/2022 | Shinohara | B25J 11/0095 |
| 2022/0093420 | A1* | 3/2022 | Shinohara | H10P 72/0412 |
| 2022/0203409 | A1 | 6/2022 | Ishii et al. | |
| 2022/0395866 | A1* | 12/2022 | Nakamura | B08B 1/12 |
| 2022/0395867 | A1* | 12/2022 | Shinohara | B08B 1/12 |

FOREIGN PATENT DOCUMENTS

| | | | |
|---|---|---|---|
| CN | 114695184 | A | 7/2022 |
| JP | H07-312335 | A | 11/1995 |
| JP | 09-029189 | A | 2/1997 |
| JP | 11-238714 | A | 8/1999 |
| JP | 11-288916 | A | 10/1999 |
| JP | 2002-324828 | A | 11/2002 |
| JP | 2003-051434 | A | 2/2003 |
| JP | 2004-237257 | A | 8/2004 |
| JP | 2004-303836 | A | 10/2004 |
| JP | 2005-228961 | A | 8/2005 |
| JP | 2008-084911 | A | 4/2008 |
| JP | 2008-124515 | A | 5/2008 |
| JP | 2019-012863 | A | 1/2009 |
| JP | 2009-194034 | A | 8/2009 |
| JP | 2010-056327 | A | 3/2010 |
| JP | 2010-093125 | A | 4/2010 |
| JP | 2013-009007 | A | 1/2013 |
| JP | 2015-023248 | A | 2/2015 |
| JP | 2015-032756 | A | 2/2015 |
| JP | 5904169 | B2 | 4/2016 |
| JP | 2018-046109 | A | 3/2018 |
| JP | 2019-003977 | A | 1/2019 |
| JP | 2020-155617 | A | 9/2020 |
| JP | 2020-167184 | A | 10/2020 |
| JP | 2021-052163 | A | 4/2021 |
| JP | 2021-052165 | A | 4/2021 |
| JP | 2021-093427 | A | 6/2021 |
| JP | 2022-051026 | A | 3/2022 |
| JP | 2022-051029 | A | 3/2022 |
| JP | 2022-061415 | A | 4/2022 |
| JP | 2022-189627 | A | 12/2022 |
| KR | 10-2010-0004043 | A | 1/2010 |
| KR | 10-2015-0011764 | A | 2/2015 |
| KR | 10-2022-0037989 | A | 3/2022 |
| KR | 10-2022-0053013 | A | 4/2022 |
| KR | 10-2022-0167230 | A | 12/2022 |
| TW | I560743 | B | 12/2016 |
| TW | 2020036670 | A | 10/2020 |
| TW | 202214357 | A | 4/2022 |
| WO | WO 2001/084621 | A1 | 11/2001 |
| WO | WO 2021/053995 | A1 | 3/2021 |

OTHER PUBLICATIONS

U.S. Appl. No. 18/391,278, filed Dec. 20, 2023 by Yoshifumi Okada et al. entitled "Substrate Processing Device and Substrate Processing Method".

U.S. Appl. No. 18/391,330, filed Dec. 20, 2023 by Yoshifumi Okada et al. entitled "Substrate Processing Device and Substrate Processing Method".

Office Action dated Aug. 27, 2024, issued in corresponding Japanese Patent Application No. 2023-007649 with an English translation.

Office Action dated Aug. 27, 2024, issued in related Japanese Patent Application No. 2023-006892 with an English translation.

Office Action dated Sep. 3, 2024, issued in related Japanese Patent Application No. 2022-207537 With an English translation.

Office Action dated Sep. 10, 2024, issued in related Japanese Patent Application No. 2022-210810 with an English translation.

* cited by examiner

*FIG.9*
PLAN VIEW
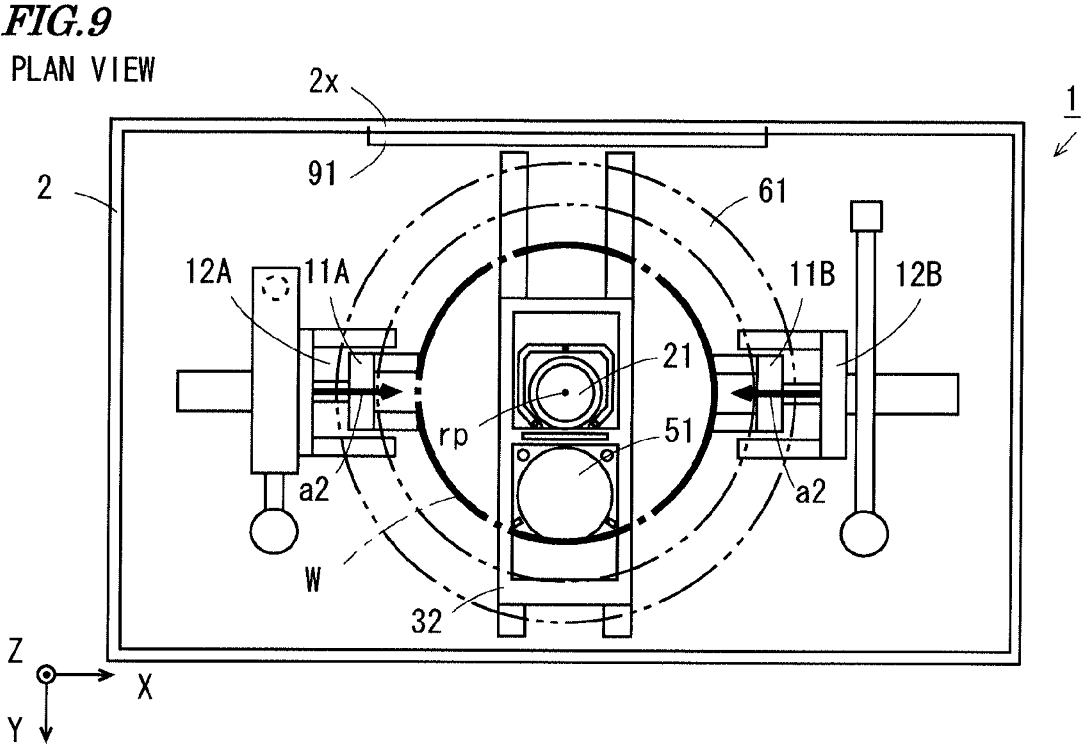
SIDE VIEW TAKEN ALONG LINE A-A
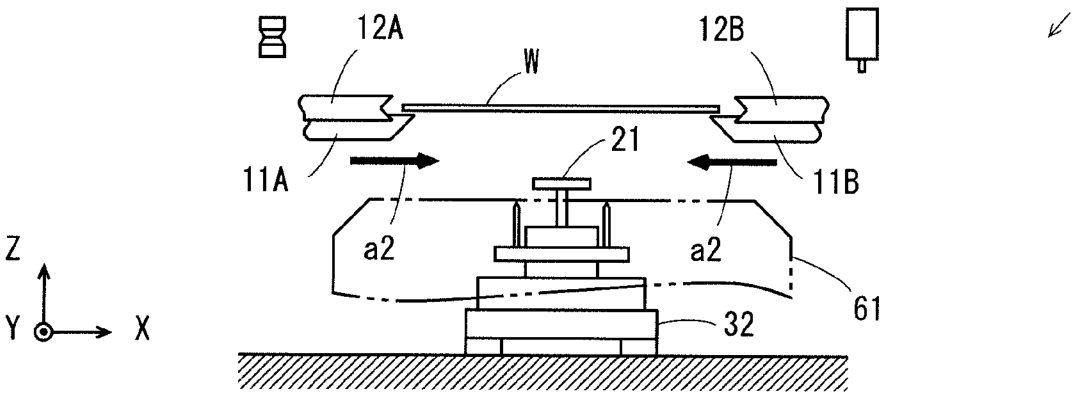
SIDE VIEW TAKEN ALONG LINE B-B
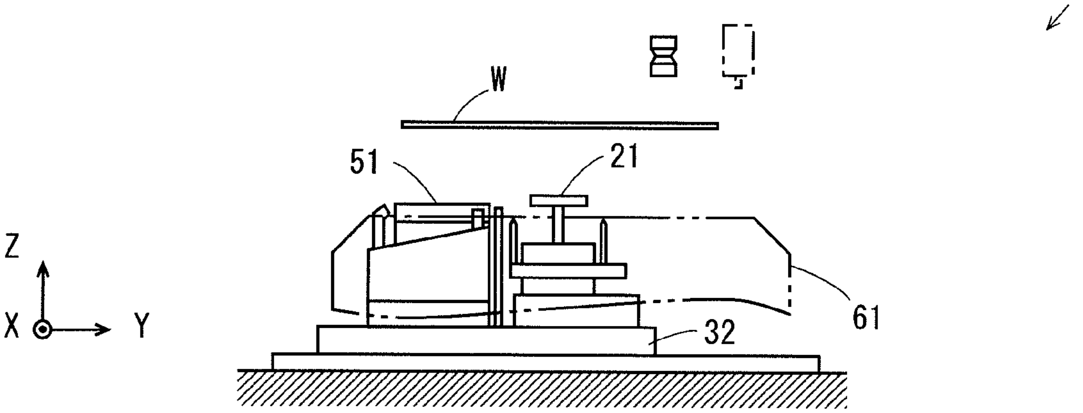

PLAN VIEW

*FIG.11*
PLAN VIEW
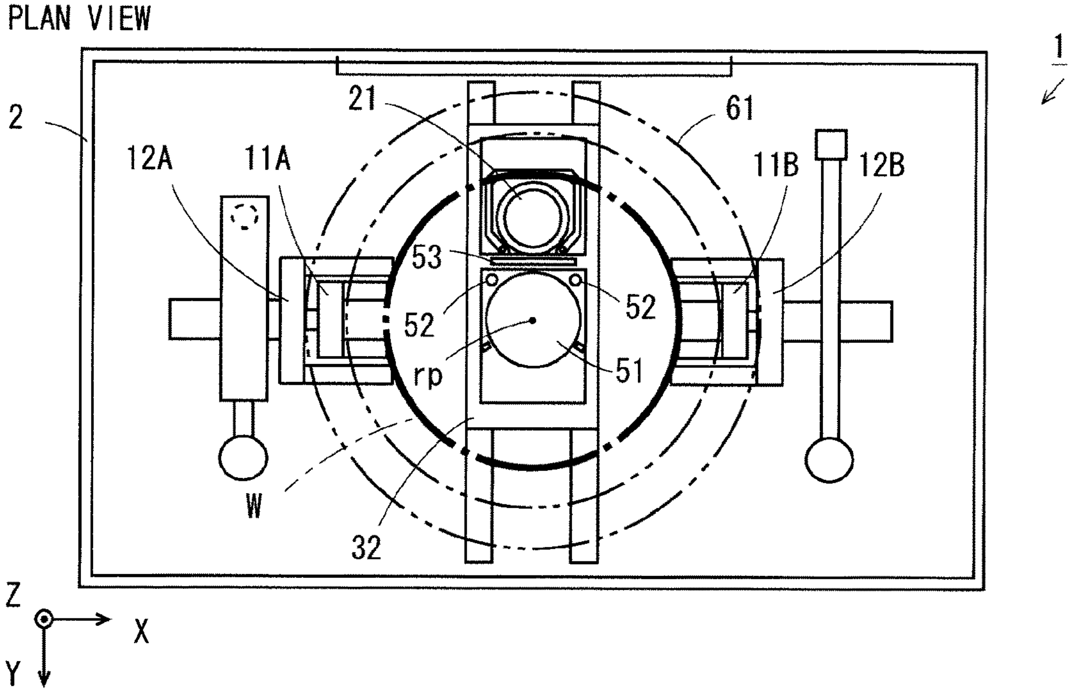
SIDE VIEW TAKEN ALONG LINE A-A
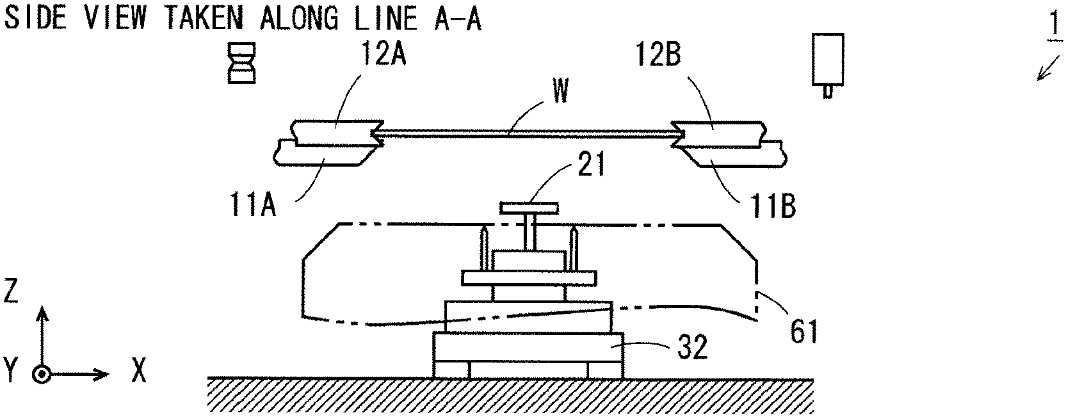
SIDE VIEW TAKEN ALONG LINE B-B
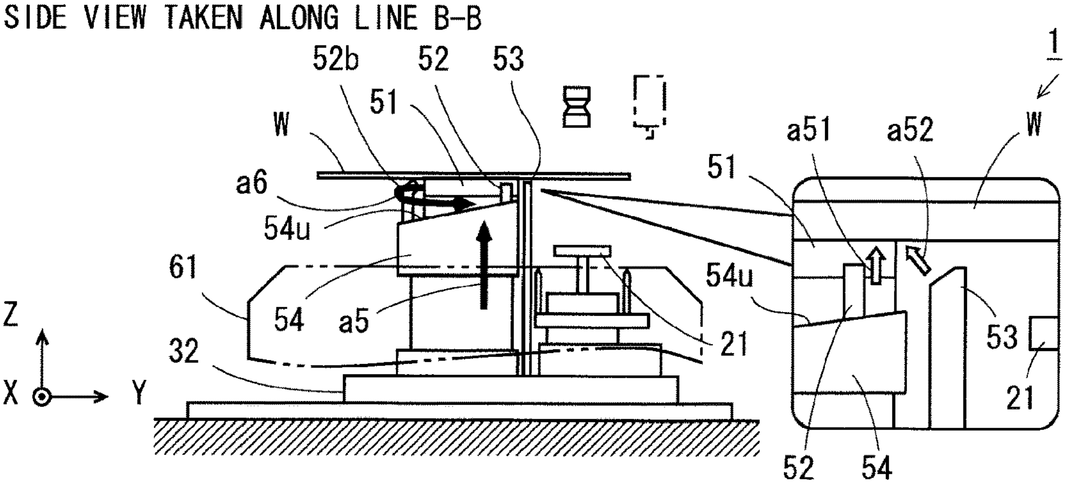

*FIG.13*
PLAN VIEW
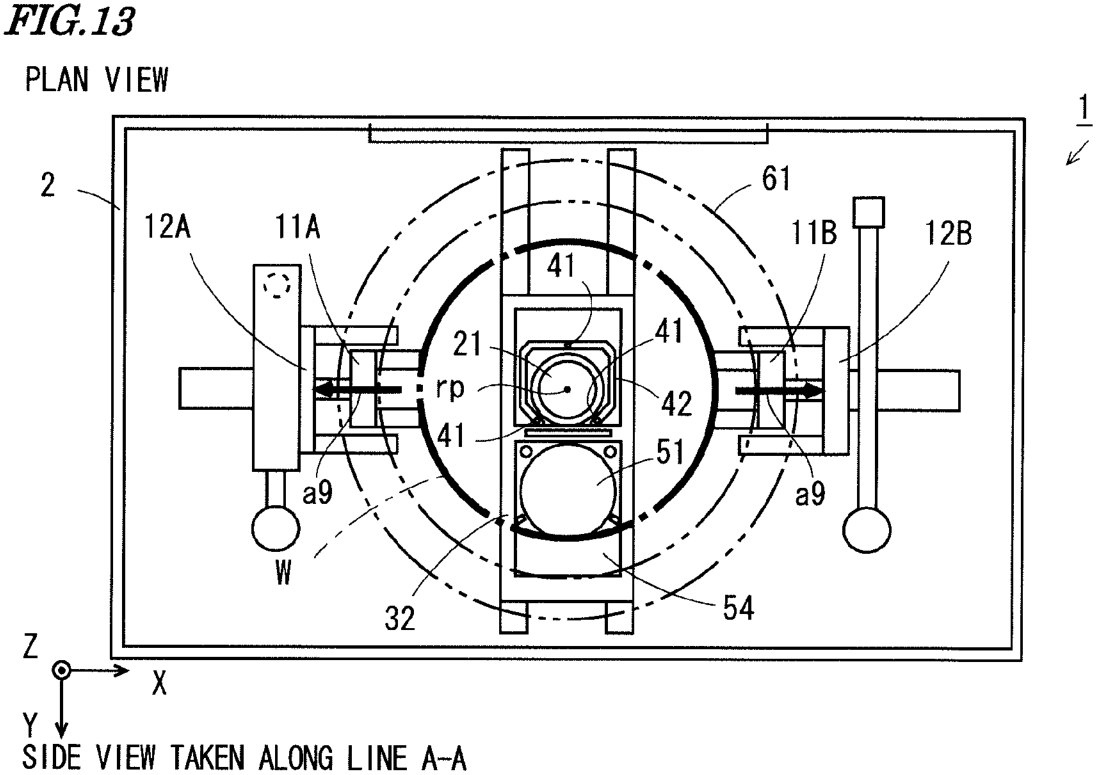
SIDE VIEW TAKEN ALONG LINE A-A
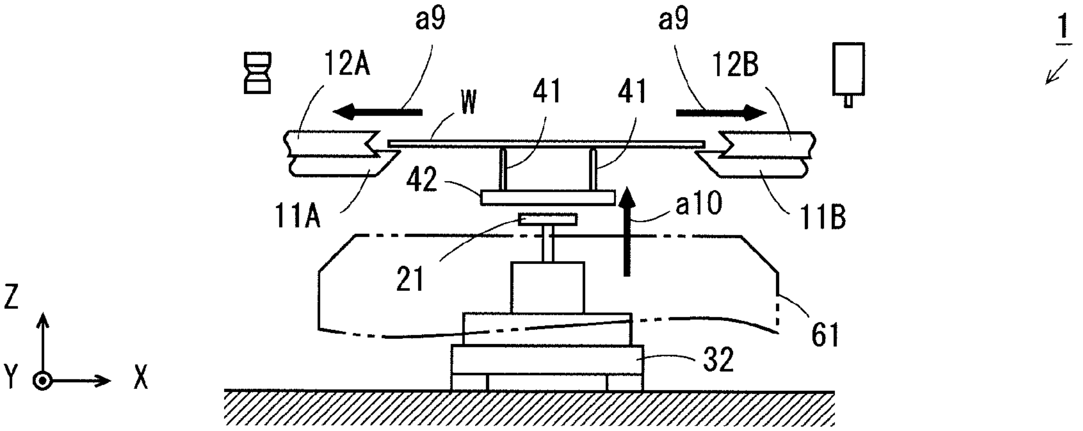
SIDE VIEW TAKEN ALONG LINE B-B
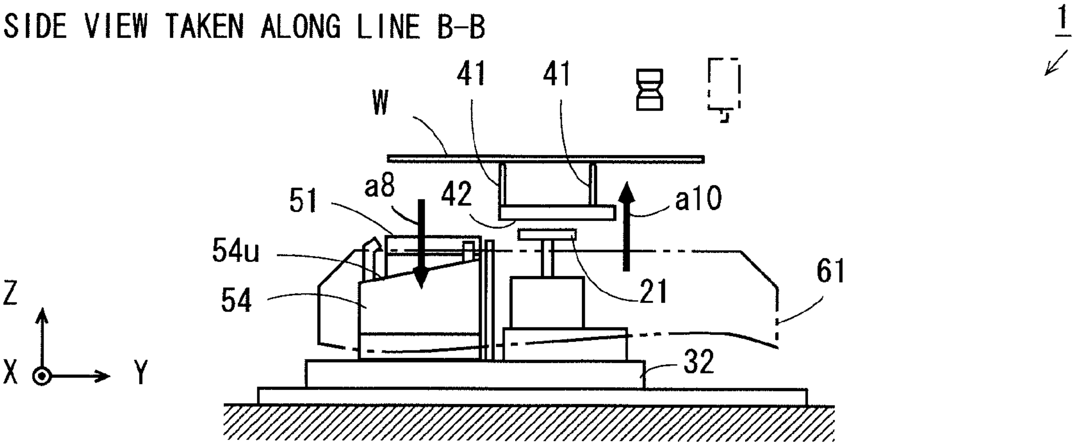

*FIG.14*
PLAN VIEW
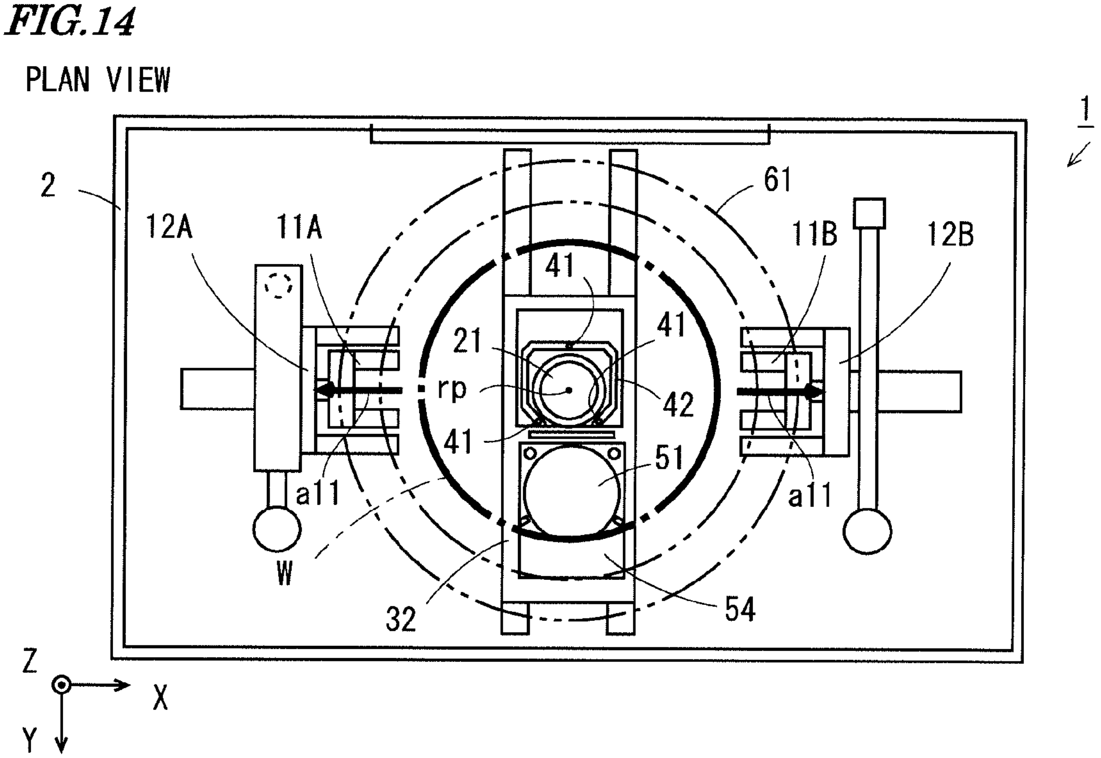
SIDE VIEW TAKEN ALONG LINE A-A
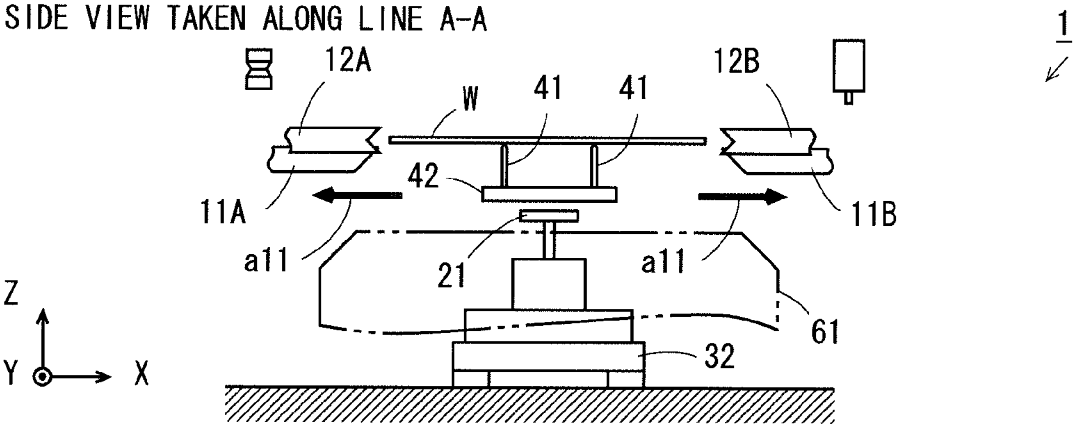
SIDE VIEW TAKEN ALONG LINE B-B
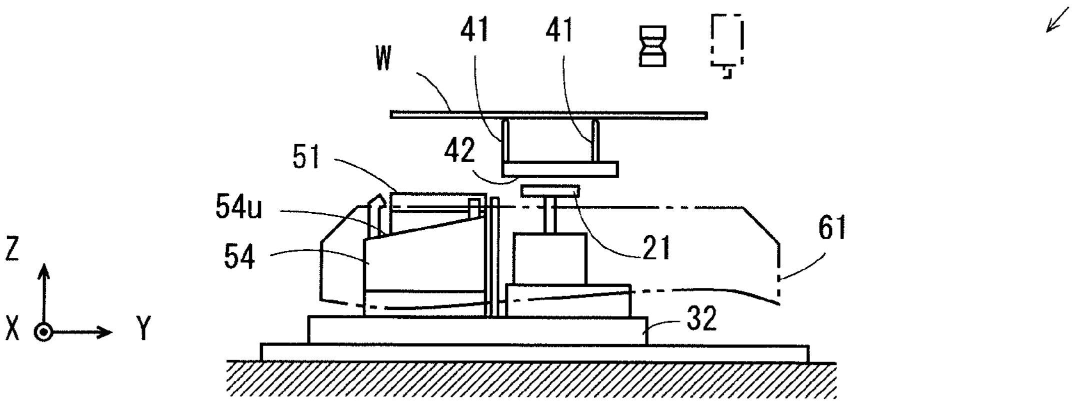

*FIG. 15*
PLAN VIEW
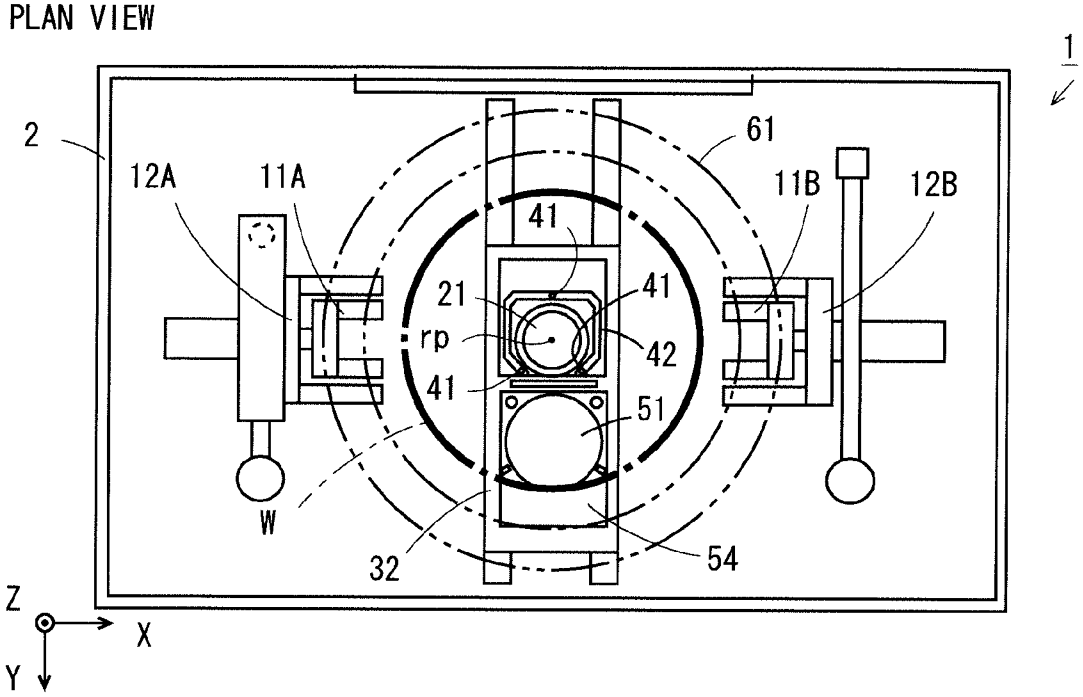
SIDE VIEW TAKEN ALONG LINE A-A
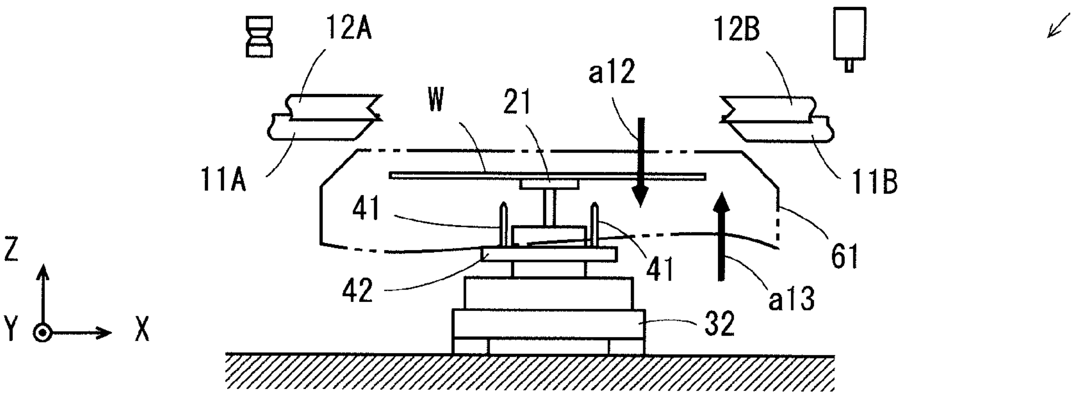
SIDE VIEW TAKEN ALONG LINE B-B
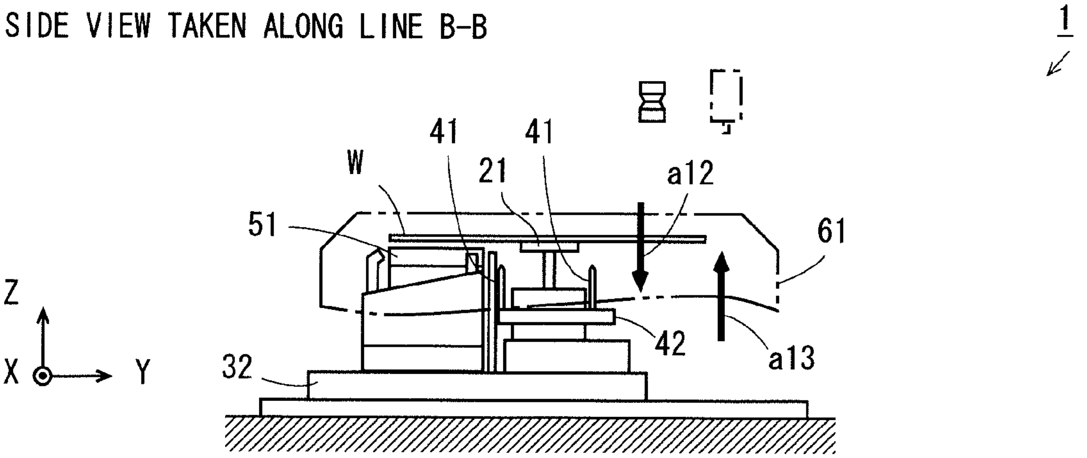

*FIG.16*
PLAN VIEW
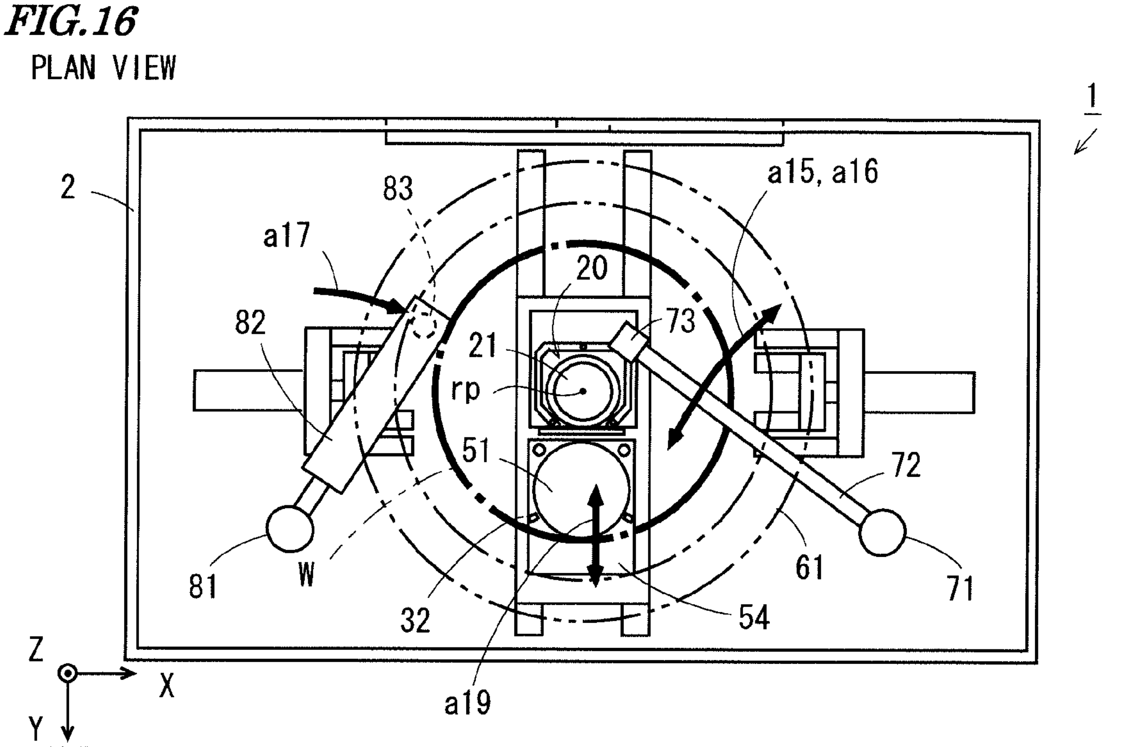
SIDE VIEW TAKEN ALONG LINE A-A
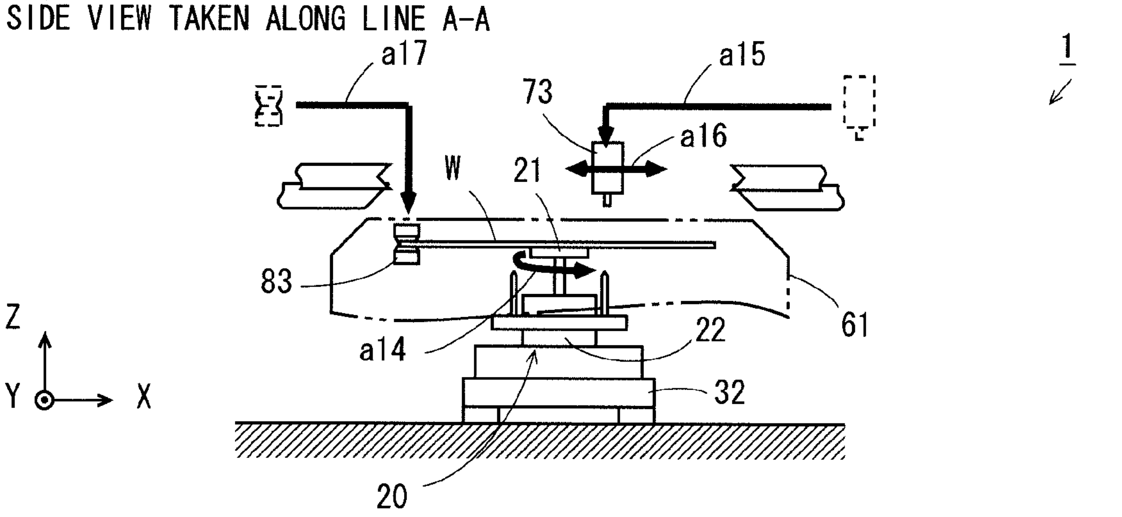
SIDE VIEW TAKEN ALONG LINE B-B
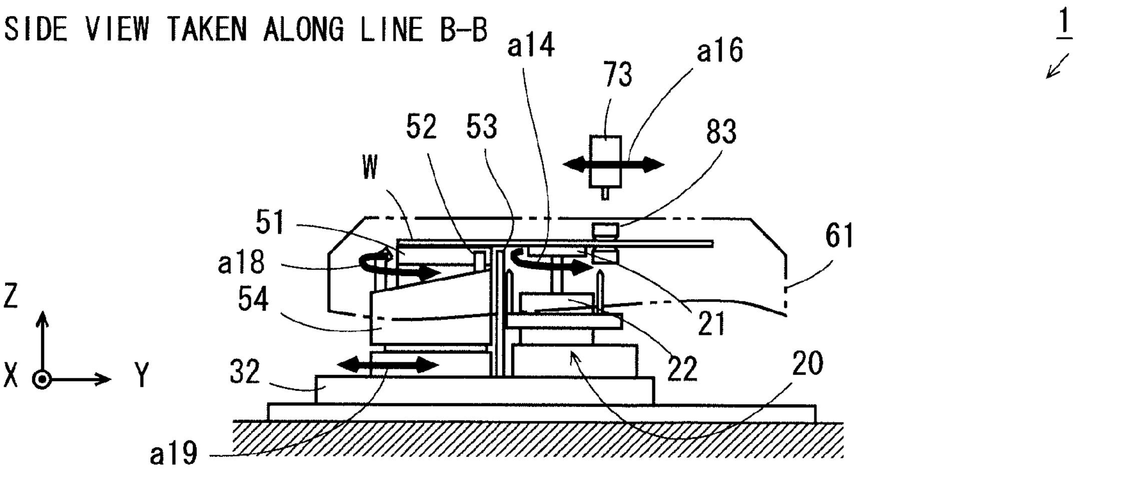

*FIG.17*
PLAN VIEW
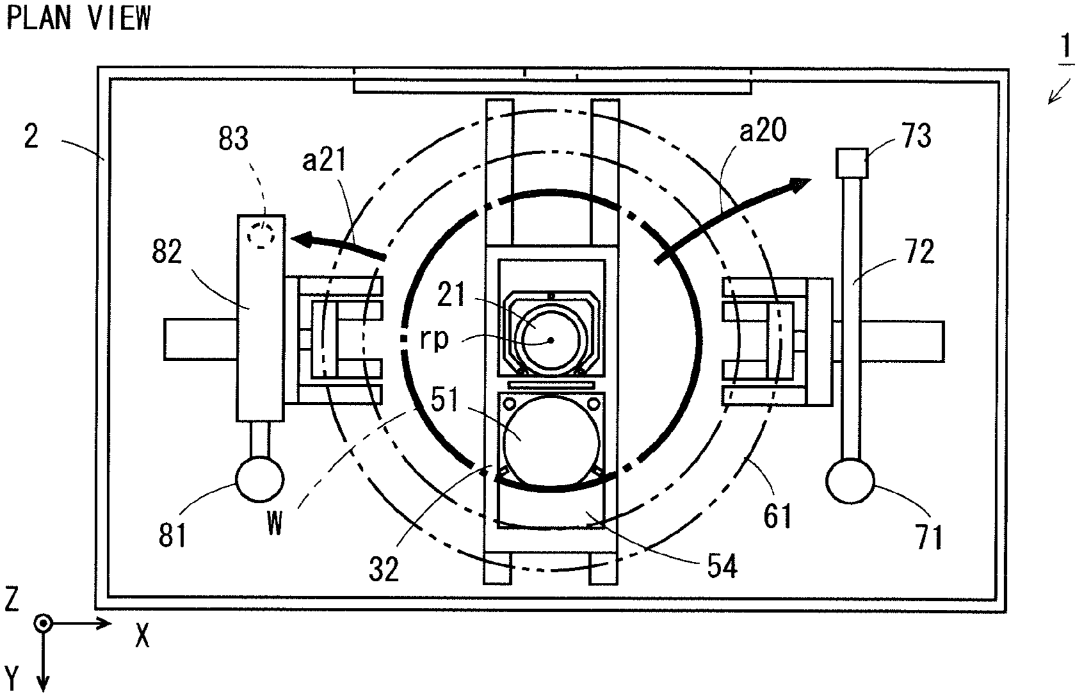
SIDE VIEW TAKEN ALONG LINE A-A
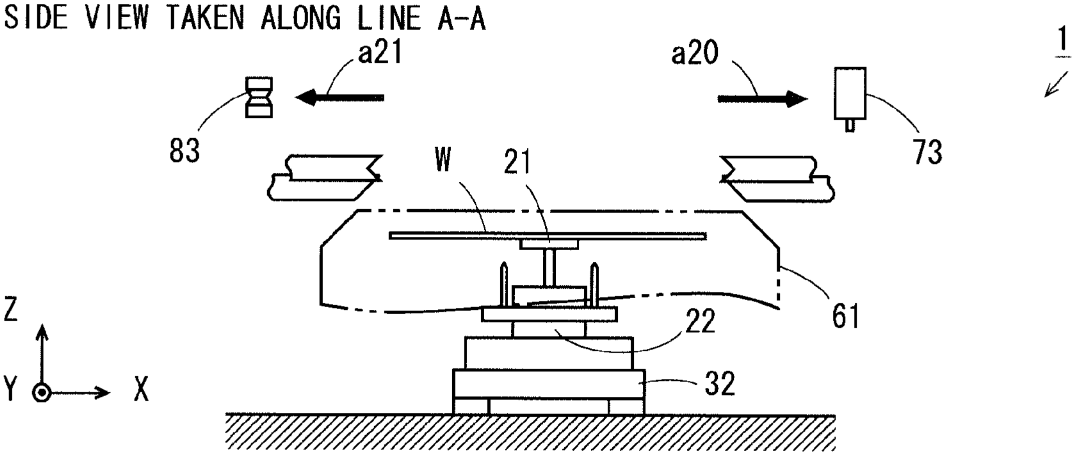
SIDE VIEW TAKEN ALONG LINE B-B
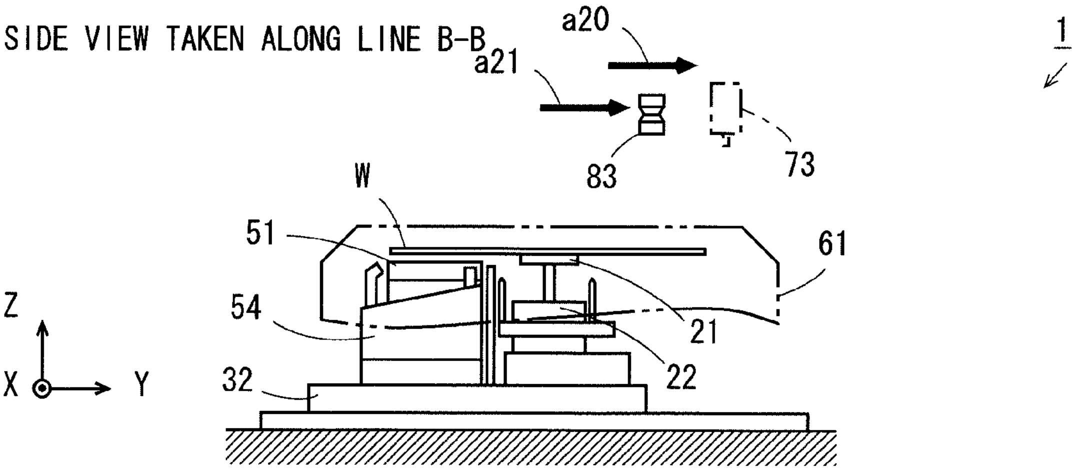

*FIG.18*
PLAN VIEW
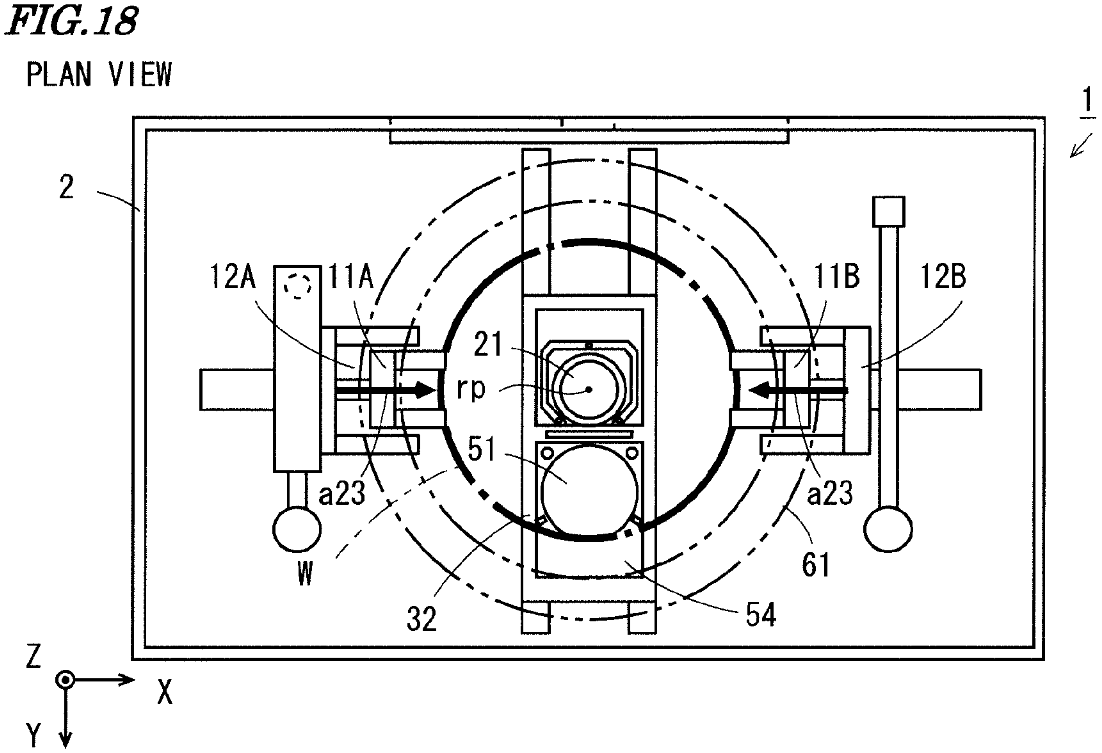
SIDE VIEW TAKEN ALONG LINE A-A
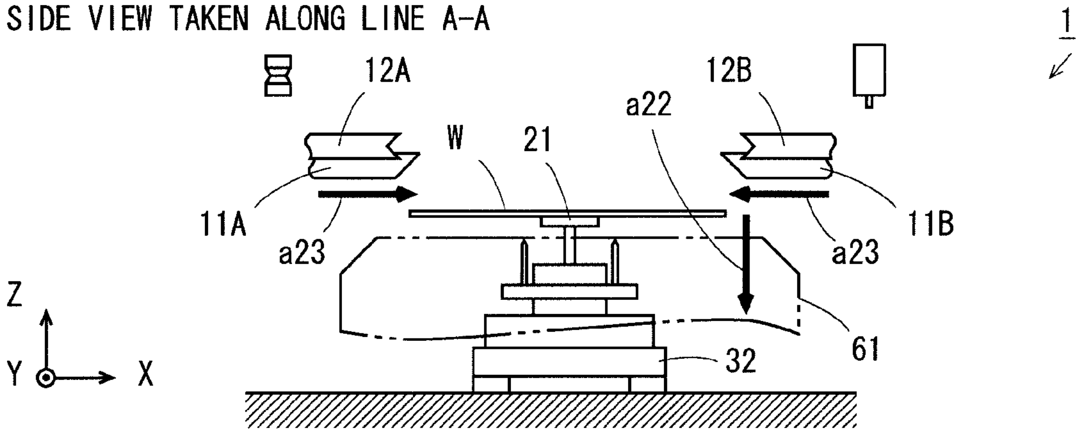
SIDE VIEW TAKEN ALONG LINE B-B
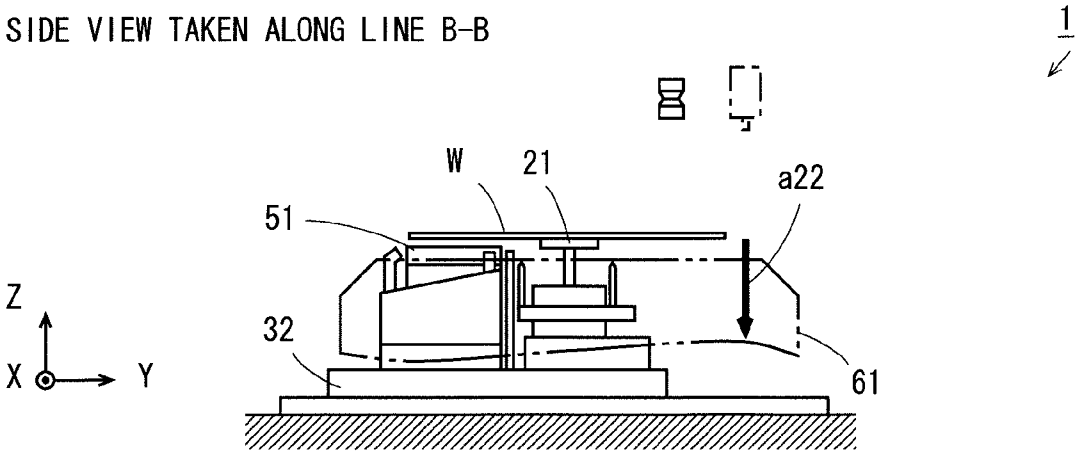

*FIG.20*

| STATE | CORRESPONDING DIAGRAM | WHETHER CLEANING LIQUID FOR CLEANING BRUSH IS SUPPLIED |
|---|---|---|
| INITIAL (WAITING) STATE | FIG. 3, FIG. 4 | SUPPLY IS ALLOWED |
| SUBSTRATE IS CARRIED IN | FIG. 8 | SUPPLY IS PROHIBITED (STOPPED) |
| SUBSTRATE IS HELD BY UPPER HOLDING DEVICE | FIG. 9, FIG. 10 | SUPPLY IS ALLOWED |
| LOWER-SURFACE CENTER REGION IS CLEANED AND DRIED | FIG. 11, FIG. 12 | SUPPLY IS ALLOWED |
| HOLDING STATE IS RELEASED | FIG. 13, FIG. 14 | SUPPLY IS ALLOWED |
| SUBSTRATE IS RECEIVED AND TRANSFERRED BETWEEN TWO HOLDING DEVICES | FIG. 13, FIG. 14, FIG. 15 | SUPPLY IS PROHIBITED (STOPPED) |
| SUBSTRATE IS HELD BETWEEN LOWER HOLDING DEVICES | FIG. 15 | SUPPLY IS ALLOWED |
| UPPER SURFACE, OUTER PERIPHERAL END, LOWER-SURFACE OUTER REGION AND BRUSH ARE CLEANED | FIG. 16 | SUPPLY IS ALLOWED |
| SUBSTRATE IS DRIED | FIG. 17 | SUPPLY IS PROHIBITED (STOPPED) |
| HOLDING STATE IS RELEASED, AND PREPARATION FOR RECEPTION OF SUBSTRATE | FIG. 18 | SUPPLY IS PROHIBITED (STOPPED) |
| CARRY-OUT OF SUBSTRATE | FIG. 19 | SUPPLY IS PROHIBITED (STOPPED) |
| INITIAL (WAITING) STATE | FIG. 3, FIG. 4 | SUPPLY IS ALLOWED |

*FIG.21*
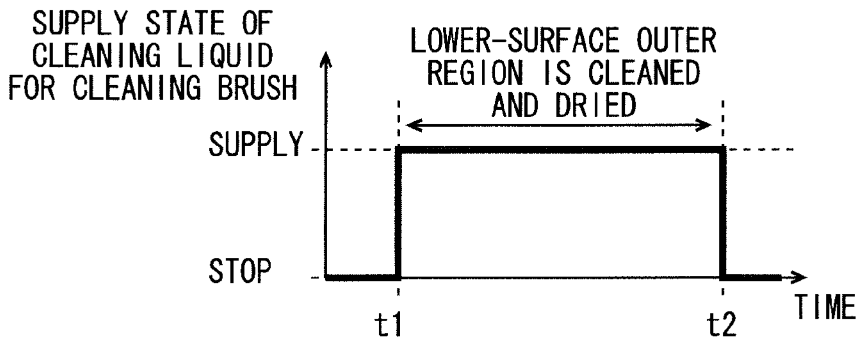
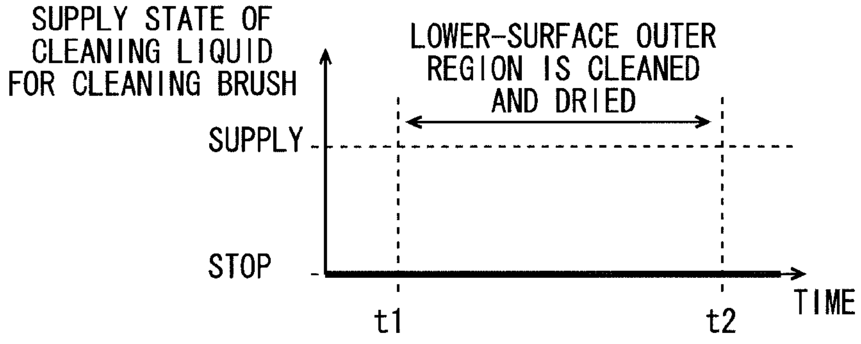
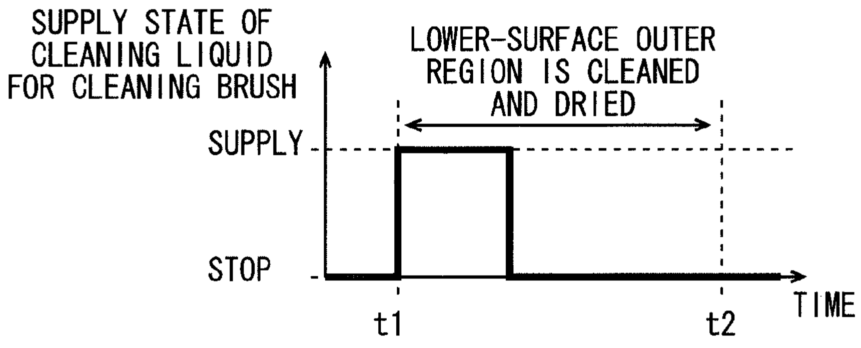

SUBSTRATE PROCESSING DEVICE AND SUBSTRATE PROCESSING METHOD

BACKGROUND

Technical Field

The present disclosure relates to a substrate processing device and a substrate processing method for cleaning of a substrate.

Description of Related Art

A substrate processing device is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

For example, the substrate cleaning device described in JP 5904169 B2 includes two suction pads for holding the back-surface peripheral portion of a wafer, a spin chuck for holding the back-surface center portion of the wafer and a brush for cleaning the back surface of the wafer. The two suction pads hold the wafer and are moved in a transverse direction. In this state, the back-surface center portion of the wafer is cleaned by the brush. Thereafter, the spin chuck receives the wafer from the suction pads. Further, the spin chuck rotates while holding the back-surface center portion of the wafer. In this state, the back-surface peripheral portion of the wafer is cleaned by the brush.

SUMMARY

In the substrate cleaning device, cleanliness of a brush is gradually degraded as a substrate is repeatedly cleaned. When the cleanliness of the brush is degraded, the substrate cannot be appropriately cleaned.

In the above-mentioned substrate cleaning device, the brush is provided with its upper surface exposed for cleaning of a wafer. In order to prevent degradation in cleanliness of the brush, it is considered that a cleaning liquid is discharged to the brush for cleaning of the brush. However, when the cleaning liquid used to clean the brush is splashed in the substrate cleaning device, the cleanliness of the substrate and the environment for cleaning the substrate may be degraded due to the splashed cleaning liquid.

An object of the present disclosure is to provide a substrate processing device and a substrate processing method with which a substrate can be prevented from being cleaned by a brush with degraded cleanliness and degradation in cleanliness of the substrate and degradation in cleanliness of an environment for cleaning the substrate caused by cleaning for the brush can be reduced.

A substrate processing device according to one aspect of the present disclosure includes a processing chamber, a transport device configured to perform a carry-in operation of carrying a substrate into the processing chamber and a carry-out operation of carrying out the substrate from the processing chamber, a first substrate holder that is provided in the processing chamber and holds the substrate that has been carried in by the transport device, a brush cleaner that is provided in the processing chamber and configured to bring a brush into contact with the substrate held by the first substrate holder to clean a lower surface of the substrate, a cleaning nozzle that is provided in the processing chamber and configured to discharge a brush cleaning liquid for cleaning the brush to the brush, a cleaning liquid supplier that supplies the brush cleaning liquid to the cleaning nozzle, and a controller that stops supply of the brush cleaning liquid to the cleaning nozzle in at least part of a period during which the carry-in operation is performed by the transport device and a period during which the carry-out operation is performed by the transport device, by controlling the cleaning liquid supplier.

A substrate processing device according to another aspect of the present disclosure includes a first substrate holder configured to hold a substrate, a brush cleaner configured to bring a brush into contact with the substrate held by the first substrate holder to clean a lower surface of the substrate, a second substrate holder configured to hold the substrate, a processor that performs predetermined processing on the substrate held by the second substrate holder, a relative mover that performs a relative moving operation of changing a position of the first substrate holder relative to the substrate by moving at least one of the first substrate holder, the second substrate holder and the substrate in order to switch a state in which the substrate is held by the first substrate holder to a state in which the substrate is held by the second substrate holder, a cleaning nozzle configured to discharge a brush cleaning liquid for cleaning the brush to the brush, a cleaning liquid supplier that supplies the brush cleaning liquid to the cleaning nozzle, and a controller that stops supply of the brush cleaning liquid to the cleaning nozzle during the relative moving operation performed by the relative mover, by controlling the cleaning liquid supplier.

A substrate processing device according to yet another aspect of the present disclosure includes a first substrate holder configured to hold a substrate, a brush cleaner configured to bring a brush into contact with the substrate held by the first substrate holder to clean a lower surface of the substrate, a second substrate holder configured to discharge a brush cleaning liquid for cleaning the brush to the brush, a cleaning liquid supplier that supplies the brush cleaning liquid to the cleaning nozzle, and a controller that stops supply of the brush cleaning liquid to the cleaning nozzle in at least part of a period during which the substrate is held by the first substrate holder, by controlling the cleaning liquid supplier.

A substrate processing device according to yet another aspect of the present disclosure includes a first substrate holder configured to hold a substrate, a brush that comes into contact with a lower surface of the substrate to clean the lower surface, a brush mover that is configured to move the brush between a cleaning position at which the brush comes into contact with the lower surface of the substrate held by the first substrate holder and a waiting position lower than the first substrate holder and spaced apart from the substrate held by first the substrate holder, a second substrate holder that is provided at a position farther upward than the first substrate holder and configured to hold the substrate, a processor that performs predetermined processing on the substrate held by the second substrate holder, a cleaning nozzle configured to discharge a brush cleaning liquid for cleaning the brush to the brush, a cleaning liquid supplier that supplies the brush cleaning liquid to the cleaning nozzle, and a controller that stops supply of the brush cleaning liquid to the cleaning nozzle with the substrate held by the second substrate holder and with the brush located at a position other than the waiting position, by controlling the cleaning liquid supplier.

A substrate cleaning device according to yet another aspect of the present disclosure includes a first substrate holder configured to hold a substrate, a brush cleaner configured to bring a brush into contact with the substrate held by the first substrate holder to clean a lower surface of the substrate, a second substrate holder that is provided at a position farther upward than the first substrate holder and configured to hold the substrate, a processor that performs predetermined processing on the substrate held by the second substrate holder, a cleaning nozzle configured to discharge a brush cleaning liquid for cleaning the brush to the brush, a cleaning liquid supplier that supplies the brush cleaning liquid to the cleaning nozzle, and an operation unit for input of a supply condition of the brush cleaning liquid supplied by the cleaning liquid supplier in a period during which the predetermined processing is performed on the substrate by the processor, a receiver that receives the supply condition of the brush cleaning liquid input by the operation unit, and a controller that adjusts a supply state of the brush cleaning liquid supplied to the cleaning nozzle in a period during which the predetermined processing is performed on the substrate by the processor, by controlling the cleaning liquid supplier in accordance with the supply condition received by the receiver.

A substrate processing method according to yet another aspect of the present disclosure includes using a transport device configured to perform a carry-in operation of carrying a substrate into a processing chamber and a carry-out operation of carrying out the substrate from the processing chamber to carry the substrate into the processing chamber, holding the substrate that has been carried in by the transport device with use of the first substrate holder in the processing chamber, bringing a brush into contact with the substrate held by the first substrate holder to clean a lower surface of the substrate in the processing chamber, discharging a brush cleaning liquid to the brush from a cleaning nozzle by supplying the brush cleaning liquid for cleaning the brush to the cleaning nozzle in the processing chamber, and carrying out the substrate from the processing chamber with use of the transport device, wherein the discharging a brush cleaning liquid to the brush includes stopping supply of the brush cleaning liquid to the cleaning nozzle at least part of a period during which the carry-in operation is performed by the transport device and a period during which the carry-out operation is performed by the transport device.

A substrate processing method according to yet another aspect of the present disclosure includes holding a substrate with use of a first substrate holder, bringing a brush into contact with the substrate held by the first substrate holder to clean a lower surface of the substrate, holding the substrate with use of a second substrate holder, performing predetermined processing on the substrate held by the second substrate holder, performing a relative moving operation of changing a position of the first substrate holder relative to the substrate by moving at least one of the first substrate holder, the second substrate holder and the substrate in order to switch a state in which the substrate is held by the first substrate holder to a state in which the substrate is held by the second substrate holder, and discharging a brush cleaning liquid to the brush from a cleaning nozzle by supplying the brush cleaning liquid for cleaning the brush to the cleaning nozzle, wherein the discharging a brush cleaning liquid to the brush includes stopping supply of the brush cleaning liquid to the cleaning nozzle during the relative moving operation.

A substrate processing method according to yet another aspect of the present disclosure includes holding a substrate with use of a first substrate holder, bringing a brush into contact with the substrate held by the first substrate holder to clean a lower surface of the substrate, discharging a brush cleaning liquid to the brush from a cleaning nozzle by supplying the brush cleaning liquid for cleaning the brush to the cleaning nozzle, wherein the discharging a brush cleaning liquid to the brush includes stopping supply of the brush cleaning liquid to the cleaning nozzle in at least part of a period during which the substrate is held by the first substrate holder.

A substrate cleaning method according to yet another aspect of the present disclosure includes holding a substrate with use of a first substrate holder, moving a brush that cleans a lower surface of the substrate by coming into contact with the lower surface between a cleaning position at which the brush comes into contact with the lower surface of the substrate held by the first substrate holder and a waiting position lower than the first substrate holder and spaced apart from the substrate held by the first substrate holder, holding the substrate with use of a second substrate holder provided at a position farther upward than the first substrate holder, performing predetermined processing on the substrate held by the second substrate holder, discharging a brush cleaning liquid to the brush from a cleaning nozzle by supplying the brush cleaning liquid for cleaning the brush to the cleaning nozzle, wherein the discharging a brush cleaning liquid to the brush includes stopping supply of the brush cleaning liquid to the cleaning nozzle with the substrate held by the second substrate holder and with the brush located at a position other than the waiting position.

A substrate processing method according to yet another aspect of the present disclosure includes holding a substrate with use of a first substrate holder, bringing a brush into contact with the substrate held by the first substrate holder to clean a lower surface of the substrate, holding the substrate with use of a second substrate holder provided at a position farther upward than the first substrate holder, performing predetermined processing on the substrate held by the second substrate holder, discharging a brush cleaning liquid to the brush from a cleaning nozzle by supplying the brush cleaning liquid for cleaning the brush to the cleaning nozzle, and in a case in which a supply condition of the brush cleaning liquid supplied to the cleaning nozzle in a period during which the predetermined processing is performed on the substrate held by the second substrate holder is input to an operation unit, receiving the supply condition of the brush cleaning liquid input by the operation unit, wherein the discharging a brush cleaning liquid to the brush includes adjusting a supply state of the brush cleaning liquid supplied to the cleaning nozzle in a period during which the predetermined processing is performed on the substrate in accordance with the supply condition received in the receiving.

With the present disclosure, it is possible to prevent a substrate from being cleaned by a brush with degraded cleanliness and reduce degradation in cleanliness of a substrate and degradation in cleanliness of an environment for cleaning the substrate caused by cleaning for the brush.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 9 is a schematic diagram for explaining the schematic operation of the substrate cleaning device of FIG. 3;

FIG. 11 is a schematic diagram for explaining the schematic operation of the substrate cleaning device of FIG. 3;

FIG. 13 is a schematic diagram for explaining the schematic operation of the substrate cleaning device of FIG. 3;

FIG. 14 is a schematic diagram for explaining the schematic operation of the substrate cleaning device of FIG. 3;

FIG. 15 is a schematic diagram for explaining the schematic operation of the substrate cleaning device of FIG. 3;

FIG. 16 is a schematic diagram for explaining the schematic operation of the substrate cleaning device of FIG. 3;

FIG. 17 is a schematic diagram for explaining the schematic operation of the substrate cleaning device of FIG. 3;

FIG. 18 is a schematic diagram for explaining the schematic operation of the substrate cleaning device of FIG. 3;

FIG. 20 is a diagram showing the relationship between a series of operations of the substrate cleaning device when the cleaning processing is performed on one substrate and whether the cleaning liquid can be supplied from a brush cleaning liquid supplier to brush nozzles;

FIG. 21 is a diagram showing a setting example in regard to the supply state of the cleaning liquid for cleaning a brush in a period during which the substrate W is held by the upper holding devices.

DETAILED DESCRIPTION

A substrate processing device and a substrate processing method according to one embodiment of the present disclosure will be described below with reference to the drawings. In the following description, a substrate refers to a semiconductor substrate (wafer), a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like. Further, in the present embodiment, the upper surface of a substrate is a circuit forming surface (main surface), and the lower surface of the substrate is the surface opposite to the circuit forming surface (back surface). Further, as for a substrate to be used in the present embodiment, at least part of the substrate has a circular outer periphery. For example, the substrate to be used in the present embodiment has a circular outer peripheral end except for a notch.

1. Configuration of Substrate Processing Device

Figure 1:
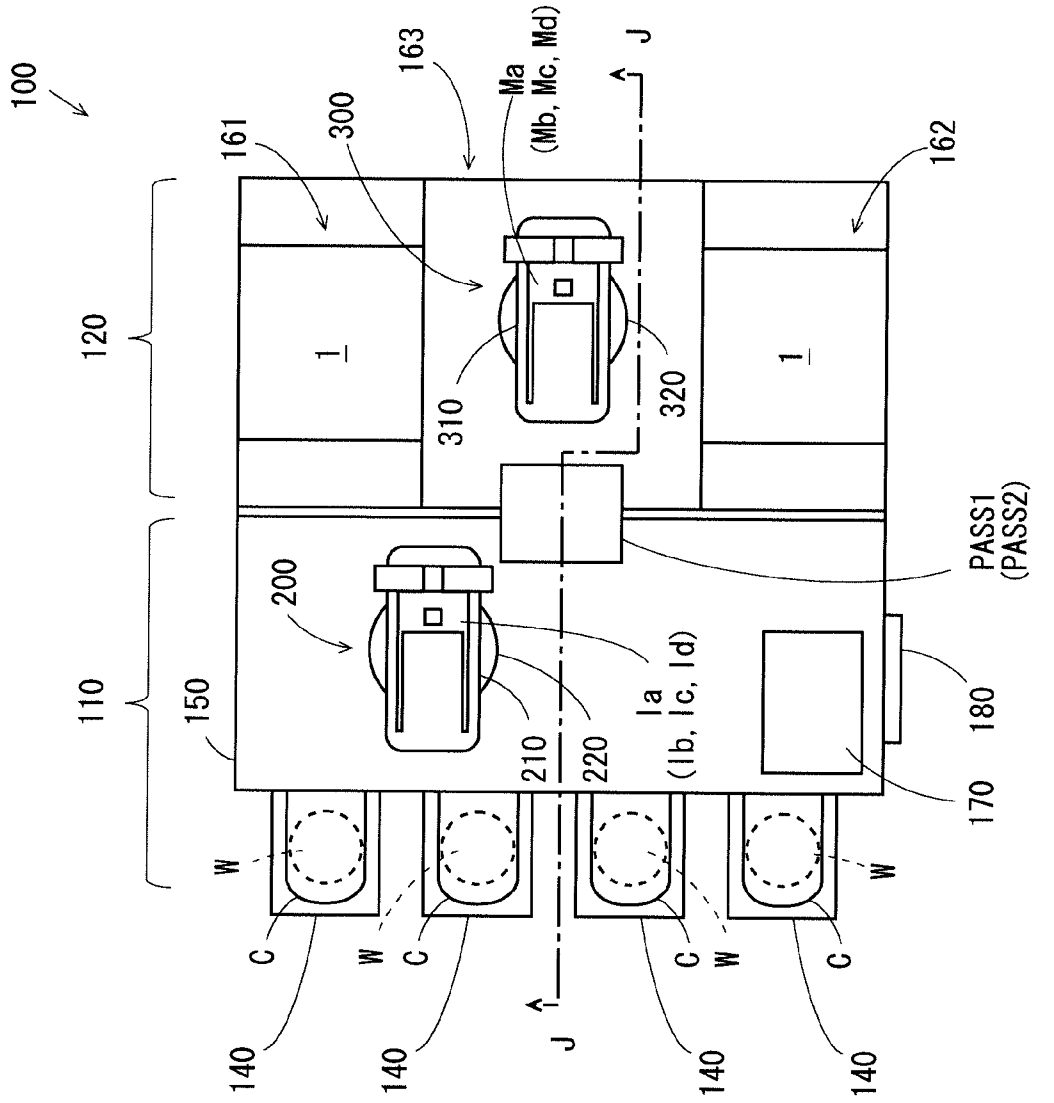
FIG. 1 is a schematic plan view of a substrate processing device according to one embodiment of the present disclosure.
Figure 2:
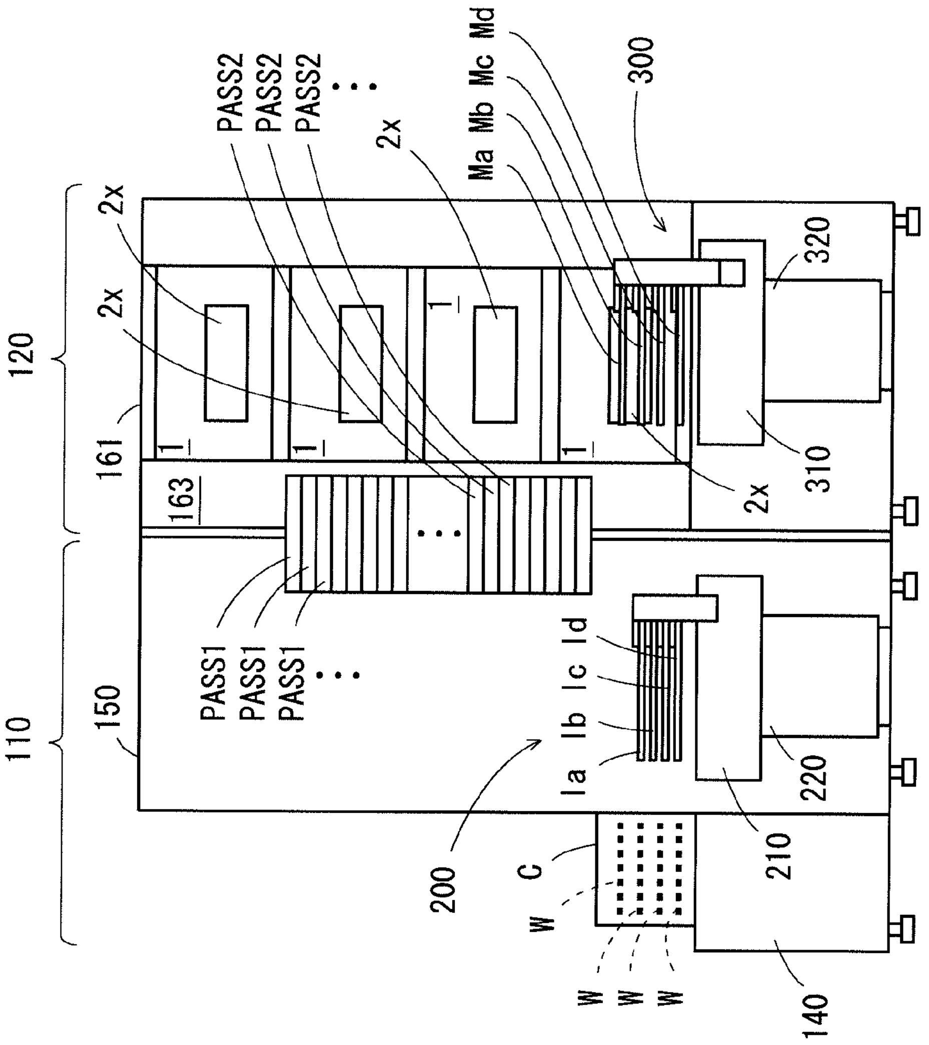
FIG. 2 is a schematic cross sectional view of the substrate processing device taken along the line J-J of FIG. 1.

FIG. 1 is a schematic plan view of a substrate processing device according to one embodiment of the present disclosure. FIG. 2 is a schematic cross sectional view of the substrate processing device 100 taken along the line J-J of FIG. 1. As shown in FIG. 1, the substrate processing device 100 according to the present embodiment has an indexer block 110 and a processing block 120. The indexer block 110 and the processing block 120 are provided to be adjacent to each other.

The indexer block 110 includes a plurality (four in the present example) of carrier platforms 140 and a transport section 150. The plurality of carrier platforms 140 are connected to the transport section 150 and arranged in a row and at intervals. On each carrier platform 140, a carrier C for storing a plurality of substrates W is placed.

In the transport section 150, an indexer robot 200 and a control device 170 are provided. The indexer robot 200 includes a plurality (four in the present example) of hands Ia, Ib, Ic, Id, a hand support member 210 and a transport driver 220.

The plurality of hands Ia to Id are configured to be capable of respectively holding a plurality of substrates W, and are provided on the hand support member 210 to be arranged in an up-and-down direction and at constant intervals as shown in FIG. 2. The hand support member 210 is formed to extend in one direction. The plurality of hands Ia to Id are supported by the hand support member 210 to be advanceable and retreatable in the one direction. The transport driver 220 is configured to be movable in a horizontal direction (the direction in which the plurality of carrier platforms 140 are arranged). The hand support member 210 is supported by the transport driver 220 to be rotatable about a vertical axis, liftable and lowerable. Further, the transport driver 220 includes a plurality of motors, an air cylinder and the like, and moves the hand support member 210 in the horizontal direction, rotates the hand support member 210 about the vertical axis, and lifts or lowers the hand support member 210 in order to transport the plurality of substrates W using the plurality of hands Ia to Id. Further, the transport driver 220 causes the plurality of hands Ia to Id to advance or retreat in the horizontal direction.

The control device 170 is made of a computer or the like including a CPU (Central Processing Unit), a RAM (Random Access Memory), a ROM (Read Only Memory) and a storage device and controls each constituent element in the substrate processing device 100.

An operation panel 180 configured to be operable by a user from the outside of the substrate processing device 100 is provided in part of the transport section 150 (part of the outer wall of the transport section 150) in the indexer block 110. The operation panel 180 is connected to the control device 170 and is used for input of operating conditions in regard to each constituent element in the substrate processing device 100 by the user, for example.

As shown in FIG. 1, the processing block 120 includes cleaning sections 161, 162 and a transport section 163. The cleaning section 161, the transport section 163 and the cleaning section 162 are adjacent to the transport section 150 and arranged in this order. In the cleaning section 161, a plurality (four in the present example) of substrate cleaning devices 1 are arranged in a stack, as shown in FIG. 2. The cleaning section 162 of FIG. 1 has the same configuration as that of the cleaning section 161. Therefore, also in the cleaning section 162, a plurality (four in the present example) of substrate cleaning devices 1 are arranged in a stack similarly to the configuration of the cleaning section 161.

Each substrate cleaning device 1 has an inlet-outlet port 2*x* (FIG. 2) for carrying the substrate W into the substrate cleaning device 1 and carrying the substrate W out from the substrate cleaning device 1. Details of the configuration and operation of the substrate cleaning device 1 will be described below.

A main robot 300 is provided in the transport section 163. The main robot 300 includes a plurality (four in the present example) of hands Ma, Mb, Mc, Md, a hand support member 310 and a transport driver 320. The plurality of hands Ma to Md have the common configuration and are provided on the hand support member 310 to be arranged in the up-and-down direction. Each hand Ma to Md is configured to be capable of holding the substrate W in a horizontal attitude.

As shown in FIG. 1, the hand support member 310 is formed to extend in one direction. The plurality of hands Ma to Md are supported by the hand support member 310 to be individually advanceable and retreatable in the one direction. The transport driver 320 is controlled by the control device 170. The hand support member 310 is supported by the transport driver 320 to be rotatable about a vertical axis, liftable and lowerable. Further, the transport driver 320 includes a plurality of motors, an air cylinder and the like, and rotates the hand support member 310 about the vertical axis, lifts or lowers the hand support member 310 in order to transport the plurality of substrates W using the plurality of hands Ma to Md. Further, the transport driver 320 causes the plurality of hands Ma to Md to advance or retreat in the horizontal direction.

A plurality (four in the present example) of substrate platforms PASS1 and a plurality of substrate platforms PASS2 for receiving and transferring the substrates W between the indexer robot 200 and the main robot 300 are stacked between the indexer block 110 and the processing block 120. A plurality of substrate platforms PASS1 are located farther upwardly than the plurality (four in the present example) of substrate platforms PASS2.

The plurality of substrate platforms PASS2 are used to transfer the substrates W from the indexer robot 200 to the main robot 300. The plurality of substrate platforms PASS1 are used to transfer the substrate W from the main robot 300 to the indexer robot 200.

The indexer robot 200 takes out an unprocessed substrate W from any one of the plurality of carriers C placed on the plurality of carrier platforms 140. Further, the indexer robot 200 places a taken and unprocessed substrate W to any one of the plurality of substrate platforms PASS2. Further, the indexer robot 200 receives a processed substrate W placed on any one of the plurality of substrate platforms PASS1 and stores the substrate W in an empty carrier C.

The main robot 300 receives a plurality of respective unprocessed substrate W placed on the plurality of respective substrate platforms PASS2 from the plurality of respective hands Ma to Md. Further, the main robot 300 carries the plurality of respective unprocessed substrate W received from the respective substrate platforms PASS2 by the plurality of respective hands Ma to Md into the plurality of respective substrate cleaning devices 1 in the cleaning section 161 or the cleaning section 162. Further, the main robot 300 carries out the plurality of respective processed substrate W in the plurality of respective substrate cleaning devices 1 using the plurality of respective hands Ma to Md. Thereafter, the main robot 300 places a processed substrate W that has been carried out from each substrate cleaning device 1 on any one of the plurality of substrate platforms PASS1.

2. Configuration of Substrate Cleaning Device 1

Figure 3:
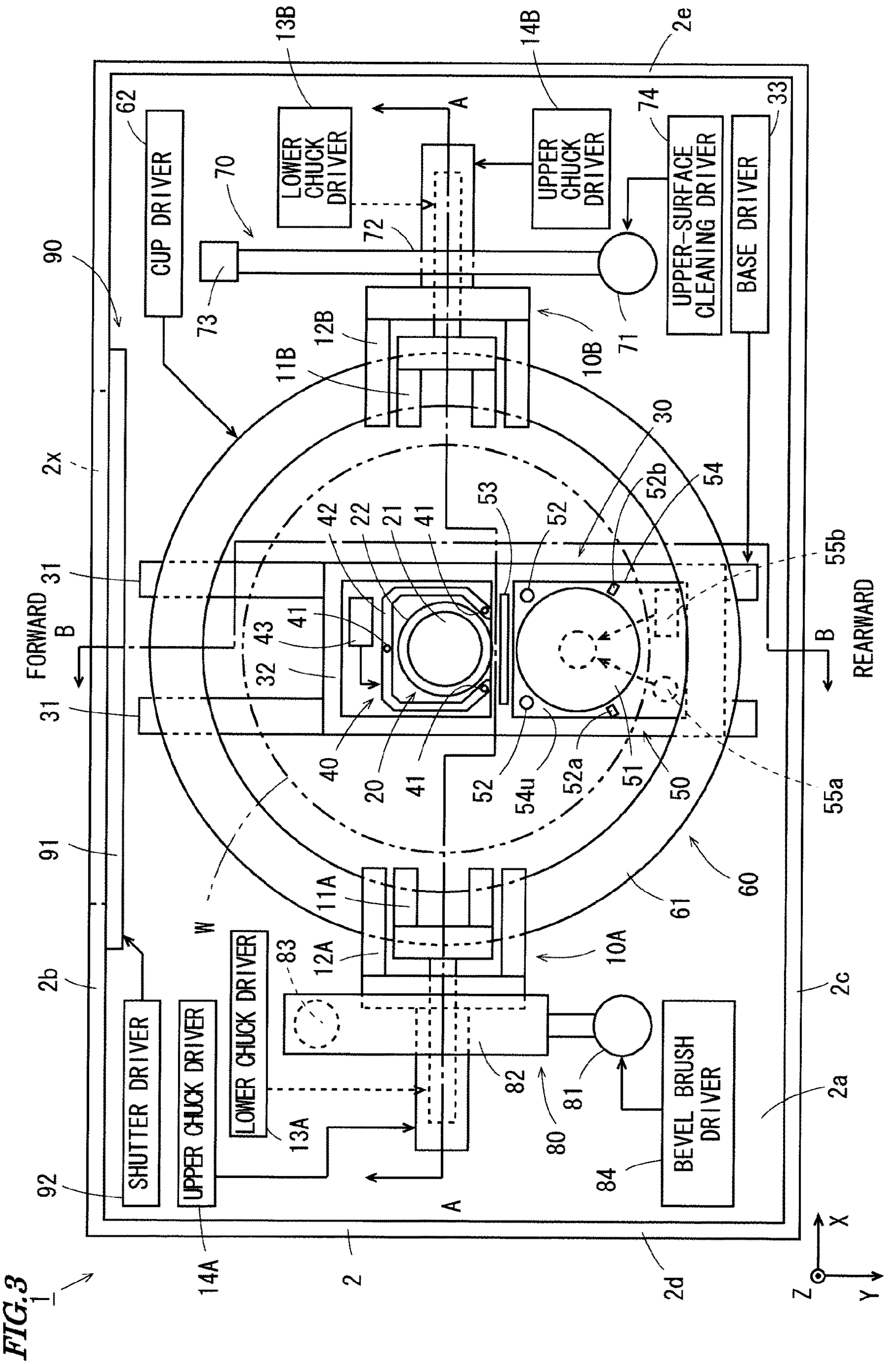
FIG. 3 is a schematic plan view of the substrate cleaning device of FIG. 1.
Figure 4:
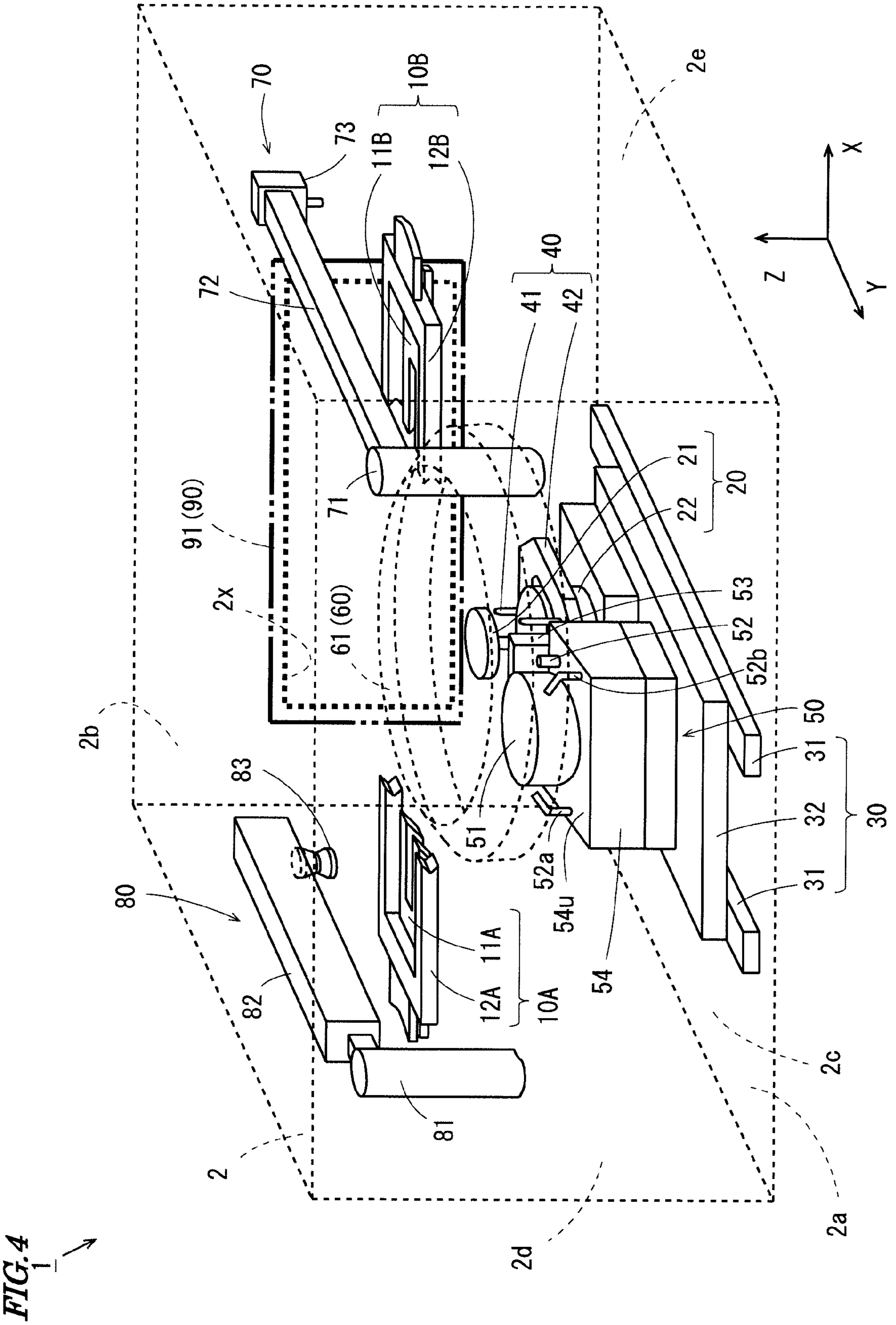
FIG. 4 is an external perspective view showing the inner configuration of the substrate cleaning device of FIG. 3.

FIG. 3 is a schematic plan view of the substrate cleaning device 1 of FIG. 1. FIG. 4 is an external perspective view showing the inner configuration of the substrate cleaning device 3 of FIG. 3. In the substrate cleaning device 1 according to the present embodiment, X, Y and Z directions orthogonal to one another are defined for the clarity of a positional relationship. In FIG. 3 and the subsequent drawings, the X, Y and Z directions are suitably indicated by arrows. The X and Y directions are orthogonal to each other within a horizontal plane, and the Z direction corresponds to a vertical direction (up-and-down direction).

As shown in FIG. 3, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 4, the unit casing 2 is indicated by the dotted lines.

The unit casing 2 has a rectangular bottom surface portion 2*a*, and four sidewall portions 2*b*, 2*c*, 2*d*, 2*e* extending upwardly from the four sides of the bottom surface portion 2*a*. The sidewall portions 2*b*, 2*c* are opposite to each other, and the sidewall portions 2*d*, 2*e* are opposite to each other. A rectangular opening is formed in the center portion of the sidewall portion 2*b*. The opening is an inlet-outlet port 2*x* for the substrate W and is used when the substrate W is carried into and carried out from the unit casing 2. In FIG. 4, the inlet-outlet port 2*x* is indicated by the thick dotted lines. In the following description, a direction directed outwardly of the unit casing 2 in the Y direction from the inside of the unit casing 2 through the inlet-outlet port 2*x* (the direction directed from the sidewall portion 2*c* toward the sidewall portion 2*b*) is referred to as forward, and its opposite direction (the direction directed from the sidewall portion 2*b* toward the sidewall portion 2*c*) is referred to as rearward.

The opening-closing device 90 is provided in a portion in which the inlet-outlet port 2*x* is formed and its vicinal region in the sidewall portion 2*b*. The opening-closing device 90 includes a shutter 91 that is configured to be capable of opening and closing the inlet-outlet port 2*x* and a shutter driver 92 that drives the shutter 91. In FIG. 4, the shutter 91 is indicated by the thick two-dots and dash lines. The shutter driver 92 drives the shutter 91 such that the shutter 91 opens the inlet-outlet port 2*x* when the substrate W is carried into and carried out from the substrate cleaning device 1. Thus, the shutter 91 is in an open state. Further, the shutter driver 92 drives the shutter 91 such that the shutter 91 closes the inlet-outlet port 2*x* when the substrate W is cleaned in the substrate cleaning device 1. Thus, the shutter 91 is in a close state.

The base device 30 is provided in the center portion of the bottom surface portion 2*a*. The base device 30 includes linear guides 31, a mobile base 32 and a base driver 33. The linear guides 31 include two rails and are provided to extend in the Y direction from the positions in the vicinity of the sidewall portion 2*b* to the positions in the vicinity of the sidewall portion 2*c* in plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of the substrate W by suction and is configured to be rotatable about an axis extending in the up-and-down direction (the axis extending in the Z direction). In the following description, a region that is to be sucked by the suction surface of the suction holder 21 in the lower surface of the substrate W when the substrate W is held by suction by the suction holder 21 is referred to as a lower-surface center region. On the other hand, a region, surrounding the lower-surface center region, in the lower surface of the substrate W is referred to as a lower-surface outer region.

The suction holding driver 22 includes a motor. The motor of the suction holding driver 22 is provided on the mobile base 32 such that its rotation shaft projects upwardly. The suction holder 21 is attached to upper end portion of the rotation shaft of the suction holding driver 22. Further, in the rotation shaft of the suction holding driver 22, a suction path for holding the substrate W by suction in the suction holder 21 is formed.

The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts and lowers the pin coupling member 42 on the mobile base 32. Thus, the plurality of support pins 41 are lifted and lowered relative to the suction holder 21.

The lower-surface cleaning device 50 includes a lower-surface brush 51, two substrate nozzles 52, two brush nozzles 52*a*, 52*b*, a gas injector 53, a lifting-lowering supporter 54, a lower-surface brush rotation driver 55*a* and a lower-surface brush lifting-lowering driver 55*b*. As shown in FIG. 4, the lifting-lowering supporter 54 is provided on the mobile base 32 to be liftable and lowerable. The lifting-lowering supporter 54 has an upper surface 54*u* that is inclined downwardly in a direction away from the suction holder 21 (rearwardly in the present example).

As shown in FIG. 3, the lower-surface brush 51 has a circular outer shape in plan view and is formed to be relatively large in the present embodiment. Specifically, the diameter of the lower-surface brush 51 is larger than the diameter of the suction surface of the suction holder 21 and is 1.3 times of the diameter of the suction surface of the suction holder 21, for example. Further, the diameter of the lower-surface brush 51 is larger than ⅓ of the diameter of the substrate W and smaller than ½ of the diameter of the substrate W. The diameter of the substrate W is 300 mm, for example.

The lower-surface brush 51 is a sponge brush and is preferably formed of a material having relatively low wettability such as a fluorine-based resin. In this case, adhesion of contaminants to the lower-surface brush 51 is reduced. Thus, the lower-surface brush 51 is less likely to be contaminated. While the lower-surface brush 51 is formed of PTFE (Polytetrafluoroethylene) in the present example, the embodiment is not limited to this. The lower-surface brush 51 may be formed of a relatively soft resin material such as PVA (polyvinyl alcohol).

The lower-surface brush 51 has a cleaning surface that can come into contact with the lower surface of the substrate W. Further, the lower-surface brush 51 is attached to the upper surface 54*u* of the lifting-lowering supporter 54 such that the cleaning surface is directed upwardly and the cleaning surface is rotatable about an axis extending in the up-and-down direction through the center of the cleaning surface.

Each of the two substrate nozzles 52 is attached to the upper surface 54*u* of the lifting-lowering supporter 54 to be located in the vicinity of the lower-surface brush 51. Further, each of the two substrate nozzles 52 is attached to the upper surface 54*u* such that a liquid discharge port is directed upwardly. A lower-surface cleaning liquid supplier 56 (FIG. 7) is connected to the substrate nozzles 52. The lower-surface cleaning liquid supplier 56 supplies a cleaning liquid for cleaning a substrate to the substrate nozzles 52. When the substrate W is cleaned by the lower-surface brush 51, the substrate nozzles 52 discharge the cleaning liquid supplied from the lower-surface cleaning liquid supplier 56 to the lower surface of the substrate W. In the present embodiment, pure water is used as the cleaning liquid to be supplied to the substrate nozzles 52.

The two brush nozzles 52*a*, 52*b* are used to clean the lower-surface brush 51. Each of the two brush nozzles 52*a*, 52*b* is attached to the upper surface 54*u* of the lifting-lowering supporter 54 to be located in the vicinity of the lower-surface brush 51. A brush cleaning liquid supplier 57 (FIG. 7) is connected to the brush nozzles 52*a*, 52*b*. The brush cleaning liquid supplier 57 supplies a cleaning liquid for cleaning a brush to the brush nozzles 52*a*, 52*b*. Thus, the cleaning liquid supplied from the brush cleaning liquid supplier 57 is discharged from the brush nozzles 52*a*, 52*b* toward the lower-surface brush 51. The cleaning liquid to be supplied to the two substrate nozzles 52 is the same as the cleaning liquid to be supplied to the two brush nozzles 52*a*, 52*b*. Therefore, in the present embodiment, pure water is used as the cleaning liquid to be supplied to the brush nozzles 52*a*, 52*b*.

Figure 5:
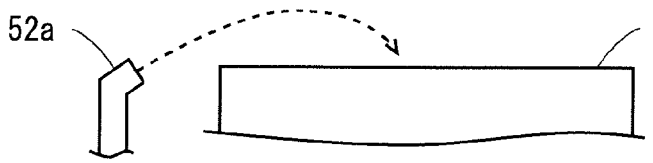
FIG. 5 is a side view showing one example of a state in which a cleaning liquid for cleaning a brush is discharged from one brush nozzle of FIG. 4 to a lower-surface brush.

FIG. 5 is a side view showing one example of a state in which a cleaning liquid for cleaning a brush is discharged from the one brush nozzle 52*a* of FIG. 4 to the lower-surface brush 51. The brush nozzle 52*a* is provided on the upper surface 54*u* of the lifting-lowering supporter 54 such that a tip portion (liquid outlet port) of the brush nozzle 52*a* is directed to a position above the lower-surface brush 51. Therefore, as indicated by the dotted arrow in FIG. 5, the cleaning liquid discharged from the brush nozzle 52*a* is guided to the center portion of the cleaning surface of the lower-surface brush 51 so as to draw a parabola from the position near the side of the lower-surface brush 51.

Figure 6:
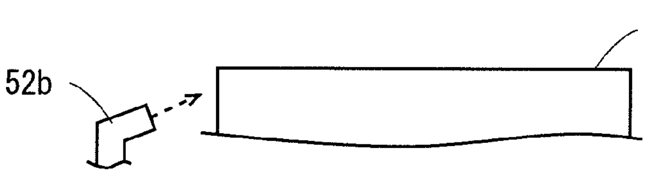
FIG. 6 is a side view showing one example of a state in which the cleaning liquid for cleaning a brush is discharged from the other brush nozzle of FIG. 4 to the lower-surface brush.

FIG. 6 is a side view showing one example of a state in which the cleaning liquid for cleaning a brush is discharged from the other brush nozzle 52*b* of FIG. 4 to the lower-surface brush 51. The brush nozzle 52*b* is provided on the upper surface 54$u$ of the lifting-lowering supporter 54 such that a tip portion (liquid outlet port) of the brush nozzle 52$b$ is directed to a side portion (an outer peripheral end) of the lower-surface brush 51.

Therefore, as indicated by the dotted arrow in FIG. 6, the cleaning liquid discharged from the brush nozzle 52$b$ is guided from the position near the side of the lower-surface brush 51 to the side portion (outer peripheral end) of the lower-surface brush 51.

The gas injector 53 of FIG. 4 is a slit-like gas injection nozzle having a gas injection port extending in one direction. The gas injector 53 is provided on the mobile base 32 so as to be liftable and lowerable independently of the other constituent elements of the lower-surface cleaning device 50. A driver for lifting and lowering the gas injector 53 will not be described. A gas injection port of the gas injector 53 is located between the lower-surface brush 51 and the suction holder 21 in plan view and directed upwardly.

An injection gas supplier 58 (FIG. 7) is connected to the gas injector 53.

The injection gas supplier 58 supplies gas to the gas injector 53. In the present embodiment, an inert gas such as a nitrogen gas is used as the gas to be supplied to the gas injector 53. The gas injector 53 injects the gas supplied from the injection gas supplier 58 to the lower surface of the substrate W during cleaning for the substrate W by the lower-surface brush 51 and during drying for the lower surface of the substrate W, as described below. In this case, a strip-shaped gas curtain extending in the X direction is formed between the lower-surface brush 51 and the suction holder 21.

The lower-surface brush rotation driver 55$a$ of FIG. 3 includes a motor, and basically rotates the lower-surface brush 51 in a period during which the substrate processing device 100 is powered on. The lower-surface brush lifting-lowering driver 55$b$ includes a stepping motor or an air cylinder, and lifts and lowers the lifting-lowering supporter 54 on the mobile base 32.

The cup device 60 is further provided in the center portion of the bottom surface portion 2$a$. The cup device 60 includes a cup 61 and a cup driver 62. The cup 61 is provided to surround the lower holding device 20 and the base device 30 in plan view, and be liftable and lowerable. In FIG. 4, the cup 61 is indicated by the dotted lines. The cup driver 62 moves the cup 61 between a lower cup position and an upper cup position in accordance with which portion of the lower surface of the substrate W is to be cleaned by the lower-surface brush 51. The lower cup position is a height position at which the upper end portion of the cup 61 is located farther downwardly than the substrate W held by suction by the suction holder 21. Further, the upper cup position is a height position at which the upper end portion of the cup 61 is located farther upwardly than the suction holder 21. With the cup 61 located at the upper cup position, the cup 61 and the suction holder 21 overlap with each other in side view.

At height positions farther upward than the cup 61, the pair of upper holding devices 10A, 10B is provided to be opposite to each other with the base device 30 held therebetween in plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (a forward-and-rearward direction) through the center of the suction holder 21 in plan view, and are provided to be movable in the X direction in a common horizontal plane. Each of the lower chucks 11A, 11B has two support pieces that can support the lower-surface peripheral portion of the substrate W from below the substrate W. The lower chuck drivers 13A, 13B move the lower chucks 11A, 11B such that the lower chucks 11A, 11B are moved close to each other or moved farther away from each other.

Similarly to the lower chucks 11A, 11B, the upper chucks 12A, 12B are arranged symmetrically with respect to the vertical plane extending in the Y direction (the forward-and-rearward direction) through the center of the suction holder 21 in plan view, and are provided to be movable in the X direction in a common horizontal plane. Each of the upper chucks 12A, 12B has two holding pieces that are configured to abut against two portions of the outer peripheral end of the substrate W and be capable of holding the outer peripheral end of the substrate W. The upper chuck drivers 14A, 14B move the upper chucks 12A, 12B such that the upper chucks 12A, 12B are moved close to each other or farther away from each other.

As shown in FIG. 3, at a position near one side of the cup 61, the upper-surface cleaning device 70 is provided to be located in the vicinity of the upper holding device 10B in plan view. The upper-surface cleaning device 70 includes a rotation support shaft 71, an arm 72, a spray nozzle 73 and an upper-surface cleaning driver 74.

The rotation support shaft 71 is supported on the bottom surface portion 2$a$ by the upper-surface cleaning driver 74 to extend in the up-and-down direction, and to be liftable, lowerable and rotatable. As shown in FIG. 4, at a position farther upward than the upper holding device 10A, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 7) is connected to the spray nozzle 73. The upper-surface cleaning fluid supplier 75 supplies a cleaning liquid and gas to the spray nozzle 73. In the present embodiment, pure water is used as the cleaning liquid to be supplied to the spray nozzle 73, and an inert gas such as a nitrogen gas is used as the gas to be supplied to the spray nozzle 73. When the upper surface of the substrate W is cleaned, the spray nozzle 73 mixes the cleaning liquid and the gas supplied from the upper-surface cleaning fluid supplier 75 to produce a fluid mixture, and injects the produced fluid mixture downwardly.

The upper-surface cleaning driver 74 includes one or a plurality of pulse motors, an air cylinder and the like, lifts and lowers the rotation support shaft 71 and rotates the rotation support shaft 71. With the above-mentioned configuration, on the upper surface of the substrate W held by suction and rotated by the suction holder 21, the spray nozzle 73 is moved in a circular arc shape. Thus, the entire upper surface of the substrate W can be cleaned.

As shown in FIG. 3, at a position near the other side of the cup 61, the end-portion cleaning device 80 is provided to be located in the vicinity of the upper holding device 10A in plan view. The end-portion cleaning device 80 includes a rotation support shaft 81, an arm 82, a bevel brush 83 and a bevel brush driver 84.

The rotation support shaft 81 is supported on the bottom surface portion 2$a$ by the bevel brush driver 84 to extend in the up-and-down direction and to be liftable, lowerable and rotatable. As shown in FIG. 4, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

In the bevel brush 83, its upper half portion has an inverse trapezoidal shape, and its lower half portion has a trapezoidal shape. With this bevel brush 83, the outer peripheral end of the substrate W can be cleaned by the center portion in the up-and-down direction of the outer peripheral surface.

The bevel brush driver 84 includes one or a plurality of pulse motors, an air cylinder and the like, lifts and lowers the rotation support shaft 81 and rotates the rotation support shaft 81. With the above-mentioned configuration, the center portion of the outer peripheral surface of the bevel brush 83 is brought into contact with the outer peripheral end of the substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of the substrate W is cleaned, a cleaning force of the bevel brush 83 in the outer peripheral end of the substrate W is improved by rotation of the bevel brush 83.

3. Control System of Substrate Processing Device

Figure 7:
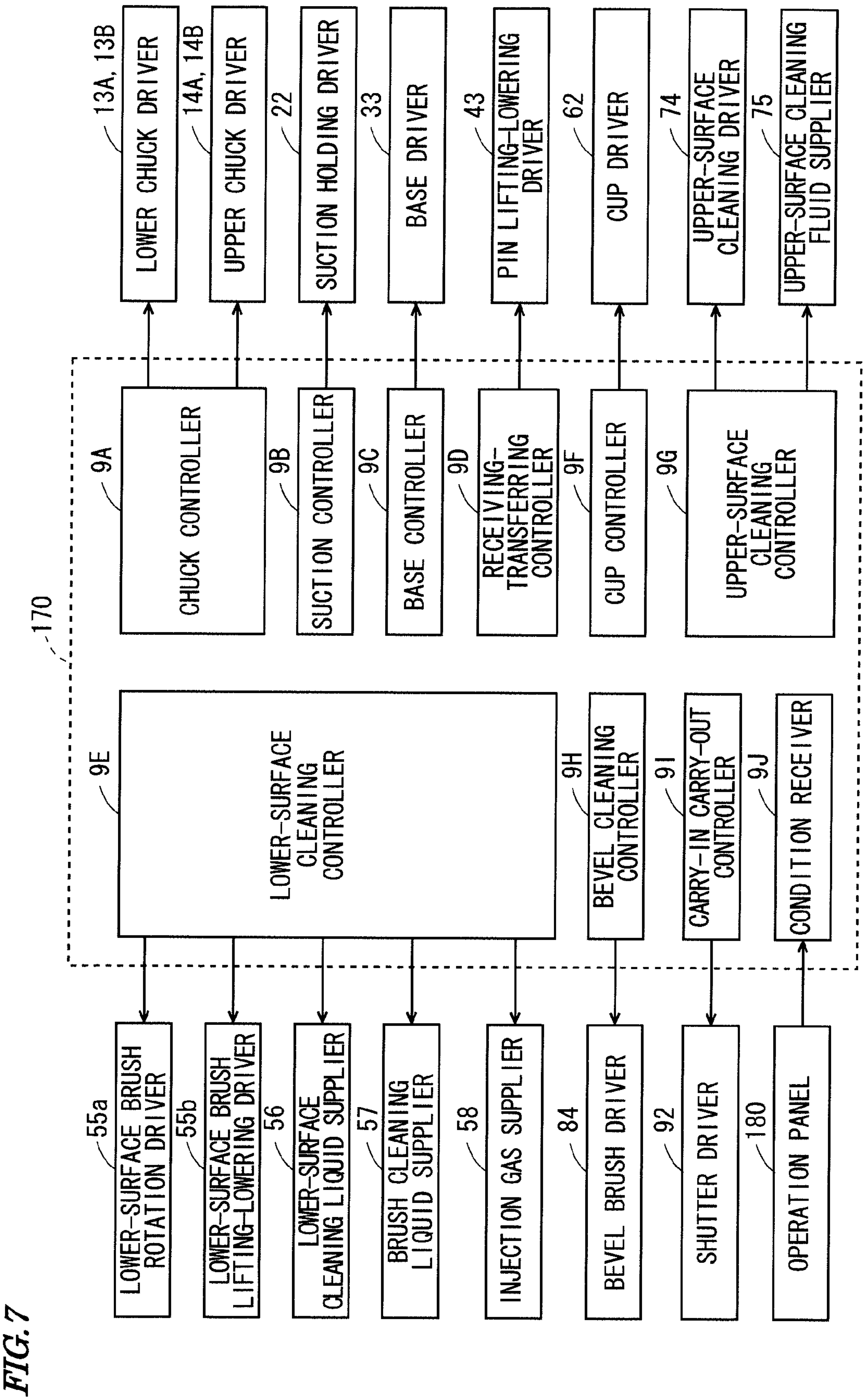
FIG. 7 is a block diagram showing the configuration of a control system of the substrate cleaning device of FIG. 1.
Figure 8:
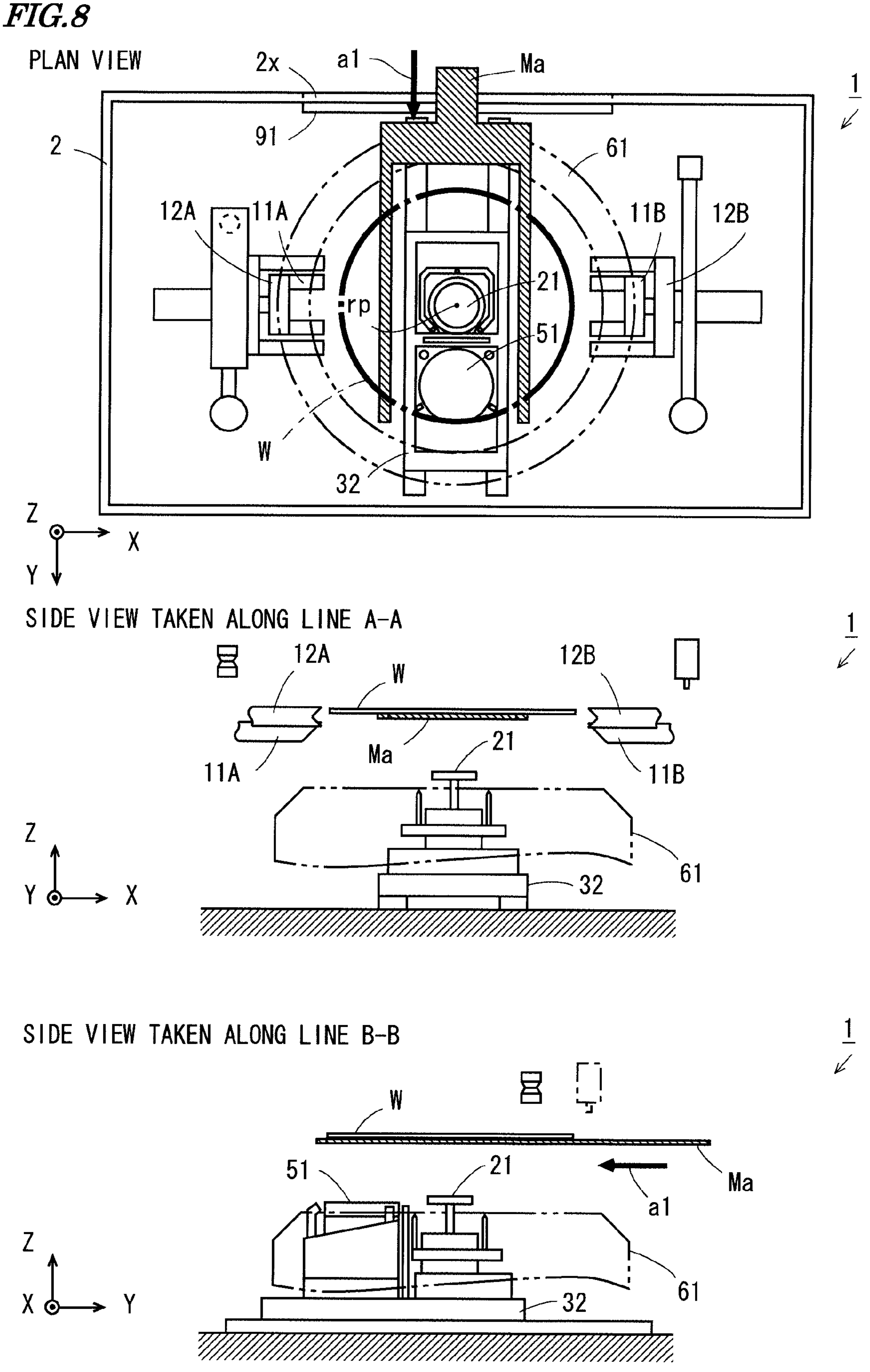
FIG. 8 is a schematic diagram for explaining the schematic operation of the substrate cleaning device of FIG. 3.

FIG. 7 is a block diagram showing the configuration of a control system of the substrate processing device 100 of FIG. 1. As described above, the control device 170 of FIG. 1 includes the CPU, the RAM, the ROM and the storage device. The RAM is used as a work area for the CPU. The ROM stores a system program. The storage device stores a substrate processing program.

FIG. 7 shows only the configuration of a portion corresponding to each of the plurality of substrate cleaning devices 1 of the control system of the substrate processing device 100 of FIG. 1. As shown in FIG. 7, as functions for controlling the operation of each of the plurality of substrate cleaning devices 1, the control device 170 includes a chuck controller 9A, a suction controller 9B, a base controller 9C, a receiving-transferring controller 9D, a lower-surface cleaning controller 9E, a cup controller 9F, an upper-surface cleaning controller 9G, a bevel cleaning controller 9H, a carry-in carry-out controller 9I and a condition receiver 9J. The functions of the control device 170 are implemented by execution of the substrate cleaning program stored in the storage device by the CPU. Part or all of the functions of the control device 170 may be implemented by hardware such as an electronic circuit.

The chuck controller 9A controls the lower chuck drivers 13A, 13B and the upper chuck drivers 14A, 14B for reception of the substrate W carried into the substrate cleaning device 1 and holding of the substrate W at a position above the suction holder 21. The suction controller 9B controls the suction holding driver 22 in order for the suction holder 21 to hold the substrate W by suction and rotate the substrate W held by suction.

The base controller 9C controls the base driver 33 for movement of the mobile base 32 with respect to the substrate W held by the upper holding devices 10A, 10B. The receiving-transferring controller 9D controls the pin lifting-lowering driver 43 for movement of the substrate W between a height position of the substrate W held by the upper holding devices 10A, 10B and a height position of the substrate W held by the suction holder 21.

The lower-surface cleaning controller 9E controls the lower-surface brush rotation driver 55*a*, the lower-surface brush lifting-lowering driver 55*b*, the lower-surface cleaning liquid supplier 56 and the injection gas supplier 58 for cleaning of the lower surface of the substrate W. Further, the lower-surface cleaning controller 9E controls the brush cleaning liquid supplier 57 for cleaning of the lower-surface brush 51. The cup controller 9F controls the cup driver 62 in order for the cup 61 to receive the cleaning liquid splashed from the substrate W when the substrate W held by suction by the suction holder 21 is cleaned.

The upper-surface cleaning controller 9G controls the upper-surface cleaning driver 74 and the upper-surface cleaning fluid supplier 75 for cleaning of the upper surface of the substrate W held by suction by the suction holder 21. The bevel cleaning controller 9H controls the bevel brush driver 84 for cleaning of the outer peripheral end of the substrate W held by suction by the suction holder 21. The carry-in carry-out controller 9I controls the shutter driver 92 for opening and closing of the inlet-outlet port 2*x* of the unit casing 2 when the substrate W is carried into and carried out from the substrate cleaning device 1.

The condition receiver 9J receives an operating condition of each constituent element in the substrate processing device 100 input through the operation panel 180 and stores the received operating condition in the storage device of the control device 170, for example. Thus, the operating condition of each constituent element in the substrate processing device 100 is set.

4. Schematic Operation of Substrate Cleaning Device 1

FIGS. 8 to 19 are schematic diagrams for explaining the schematic operation of the substrate cleaning device 1 of FIG. 3. In each of FIGS. 8 to 19, a plan view of the substrate cleaning device 1 is shown in the upper field. Further, the side view of the lower holding device 20 and its peripheral portions as viewed in the Y direction is shown in the middle field, and the side view of the lower holding device 20 and its peripheral portions as viewed in the X direction is shown in the bottom field. The side view in the middle field corresponds to the side view of the substrate cleaning device 1 taken along the line A-A of FIG. 3, and the side view in the bottom field corresponds to the side view of the substrate cleaning device 1 taken along the line B-B of FIG. 3. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 8 to 19, the cup 61 is indicated by the two-dots and dash lines, and the outer shape of the substrate W is indicated by the thick one-dot and dash lines.

In the initial state (waiting state) before the substrate W is carried into the substrate cleaning device 1, the inlet-outlet port 2*x* is closed by the shutter 91 of the opening-closing device 90. Further, as shown in FIG. 3, the lower chucks 11A, 11B are maintained in a state in which the distance between the lower chucks 11A, 11B is sufficiently larger than the diameter of the substrate W. Further, the upper chucks 12A, 12B are also maintained with the distance between the upper chucks 12A, 12B being sufficiently larger than the diameter of the substrate W.

Further, the mobile base 32 of the base device 30 is arranged such that the center of the suction holder 21 is located at the center of the cup 61 in plan view. The lower-surface cleaning device 50 is at a position spaced apart from the suction holder 21 by a certain distance in the Y direction on the mobile base 32. The cleaning surface (upper end portion) of the lower-surface brush 51 of the lower-surface cleaning device 50 is located farther downwardly than the suction holder 21. The position of the lower-surface brush 51 in the up-and-down direction (Z direction) in the initial state is referred to as a waiting position. With the substrate W held by the suction holder 21, the waiting position is below the substrate W. In particular, in the present embodiment, the waiting position is equivalent to the lowest position in a range of the up-and-down direction in which the lower-surface brush 51 is liftable and lowerable by the lifting-lowering supporter 54.

Further, in the initial state, the receiving-transferring device 40 is in a state in which the plurality of support pins 41 are located farther downwardly than the suction holder 21. Further, the cup 61 of the cup device 60 is in the lower cup position. In the following description, the center position of the cup 61 in plan view is referred to as a plane reference position rp. Further, the position of the mobile base 32 located on the bottom surface portion 2_a_ when the center of the suction holder 21 is in the plane reference position rp in plan view is referred to as a first horizontal position.

The substrate W is carried into the unit casing 2 of the substrate cleaning device 1. Specifically, the shutter 91 opens the inlet-outlet port 2_x_ immediately before the substrate W is carried in. Thereafter, as indicated by the thick solid arrow a1 in FIG. 8, the hand (the hand Ma in the present example) of the main robot 300 of FIG. 1 enters the unit casing 2 through the inlet-outlet port 2_x_ and move the substrate W to a position substantially center of the unit casing 2. At this time, the substrate W held by the hand Ma is located between the upper chuck 12A and the upper chuck 12B.

Next, as indicated by the thick solid arrows a2 in FIG. 9, the lower chucks 11A, 11B move closer to each other such that a plurality of support pieces of the lower chucks 11A, 11B are located below the lower-surface peripheral portion of the substrate W. In this state, the hand Ma is lowered, and the substrate W held by the hand Ma is placed on the pair of lower chucks 11A, 11B. A plurality of portions of the lower-surface peripheral portion of the substrate W are respectively supported by the plurality of support pieces of the lower chucks 11A, 11B. Thereafter, the empty hand Ma exits from the inlet-outlet port 2_x_. After the hand Ma exits, the shutter 91 closes the inlet-outlet port 2_x_.

In the following description, an operation of carrying the substrate W into one substrate cleaning device 1 performed by the main robot 300 of FIG. 1 is referred to as a carry-in operation. The carry-in operation includes advancement and retreat of the hand Ma with at least part of the hand Ma in the unit casing 2. Therefore, in the present embodiment, a period during which the carry-in operation is performed by the main robot 300 includes a period during which the substrate W is carried into one substrate cleaning device 1 and any one of the hands (Ma to Md) of the main robot 300 is in the unit casing 2.

Figure 10:
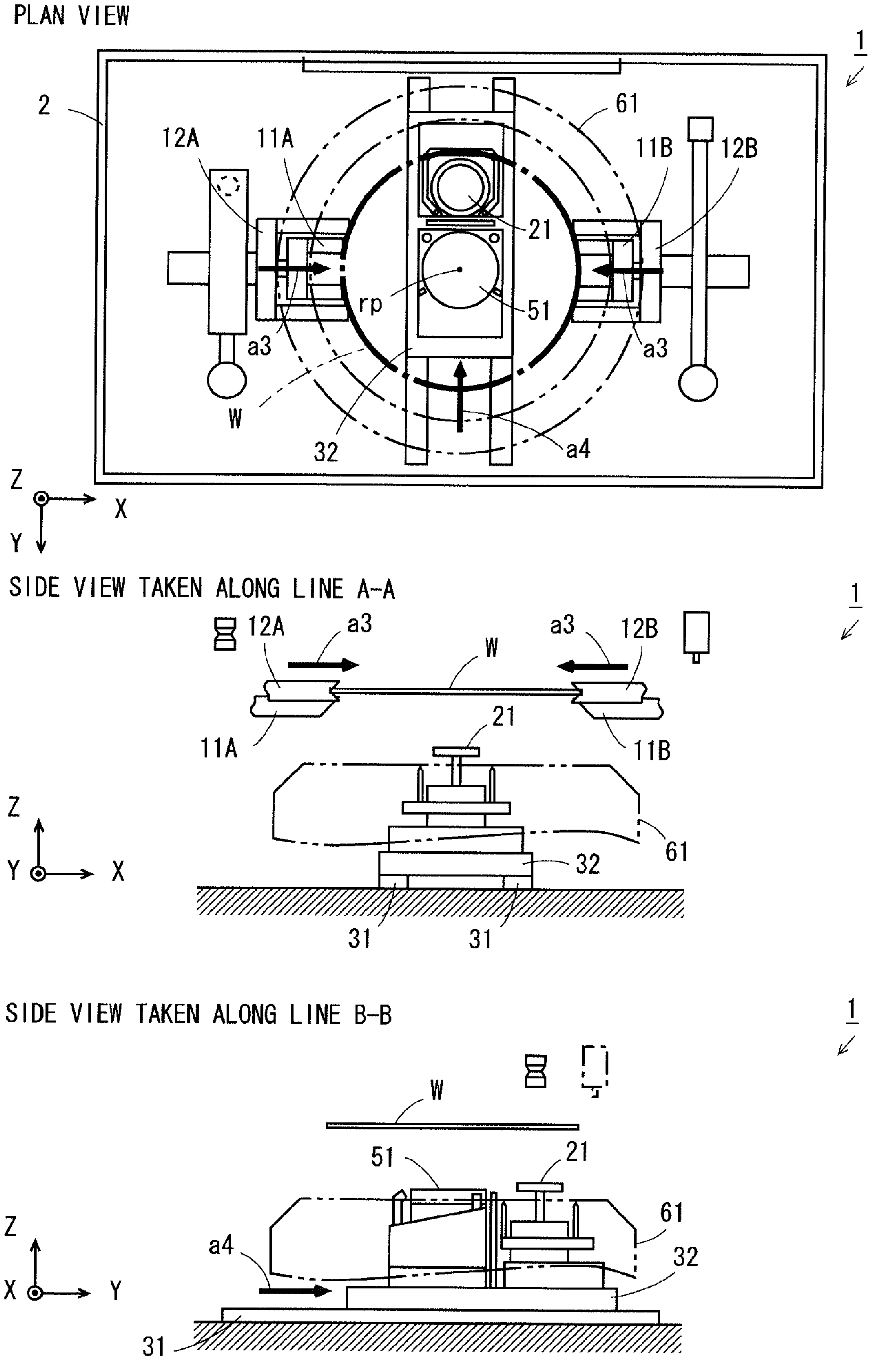
FIG. 10 is a schematic diagram for explaining the schematic operation of the substrate cleaning device of FIG. 3.

Next, as indicated by the thick solid arrows a3 in FIG. 10, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B. Further, as indicated by the thick solid arrow a4 in FIG. 10, the mobile base 32 is moved forwardly from the first horizontal position such that suction holder 21 deviates from the plane reference position rp by a predetermined distance and the center of the lower-surface brush 51 is located at the plane reference position rp. The position of the mobile base 32 on the bottom surface portion 2_a_ when the center of the lower-surface brush 51 is located at the plate reference position rp in plan view is referred to as a second horizontal position.

Next, as indicated by the thick solid arrow a5 in FIG. 11, the lifting-lowering supporter 54 is lifted such that the cleaning surface of the lower-surface brush 51 located at the waiting position comes into contact with the lower-surface center region of the substrate W. The position of the lower-surface brush 51 coming into contact with the lower surface of the substrate W with the substrate W held by the upper holding devices 10A, 10B is referred to as a first processing position. Further, as indicated by the thick solid arrow a6 in FIG. 11, the lower-surface brush 51 is rotated (spins) about the axis extending in the up-and-down direction. Thus, contaminants adhering to the lower-surface center region of the substrate W are physically stripped by the lower-surface brush 51.

In the bottom field in FIG. 11, an enlarged side view of a portion in which the lower-surface brush 51 comes into contact with the lower surface of the substrate W is shown in a balloon. As shown in the balloon, with the lower-surface brush 51 in contact with the substrate W, the substrate nozzle 52 and the gas injector 53 are held at positions close to the lower surface of the substrate W. At this time, as indicated by the outlined arrow a51, the substrate nozzle 52 discharges the cleaning liquid toward the lower surface of the substrate W at a position in the vicinity of the lower-surface brush 51. Thus, the cleaning liquid that has been supplied to the lower surface of the substrate W from the substrate nozzles 52 is guided to the portion in which the lower-surface brush 51 and the substrate W come into contact with each other, whereby contaminants that have been removed from the back surface of the substrate W by the lower-surface brush 51 are washed away by the cleaning liquid. In this manner, in the lower-surface cleaning device 50, the substrate nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

Here, the upper surface 54_u_ of the lifting-lowering supporter 54 is inclined downwardly in a direction away from the suction holder 21. In this case, in a case in which the cleaning liquid including contaminants falls on the lifting-lowering supporter 54 from the lower surface of the substrate W, the cleaning liquid received by the upper surface 54_u_ is guided in a direction away from the suction holder 21.

Further, when the lower surface of the substrate W is cleaned by the lower-surface brush 51, the gas injector 53 injects gas toward the lower surface of the substrate W at a position between the lower-surface brush 51 and the suction holder 21 as indicated by the outlined arrow a52 in the balloon of FIG. 11. In the present embodiment, the gas injector 53 is attached onto the mobile base 32 such that the gas injection port extends in the X direction. In this case, when gas is injected to the lower surface of the substrate W from the gas injector 53, a strip-shaped gas curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower surface of the substrate W is cleaned by the lower-surface brush 51, the cleaning liquid including contaminants is prevented from adhering to the suction holder 21, and the suction surface of the suction holder 21 is maintained clean.

While the gas injector 53 injects gas obliquely upwardly toward the lower-surface brush 51 from the gas injector 53 as indicated by the outlined arrow a52 in the example of FIG. 11, the present disclosure is not limited to this. The gas injector 53 may inject gas in the Z direction toward the lower surface of the substrate W from the gas injector 53.

Next, in the state of FIG. 11, when the cleaning of the lower-surface center region of the substrate W is completed, the lifting-lowering supporter 54 is lowered such that the cleaning surface of the lower-surface brush 51 is spaced apart from the substrate W by a predetermined distance. Further, discharging of the cleaning liquid from the substrate nozzles 52 to the substrate W is stopped. At this time, the injection of gas from the gas injector 53 to the substrate W continues.

Figure 12:
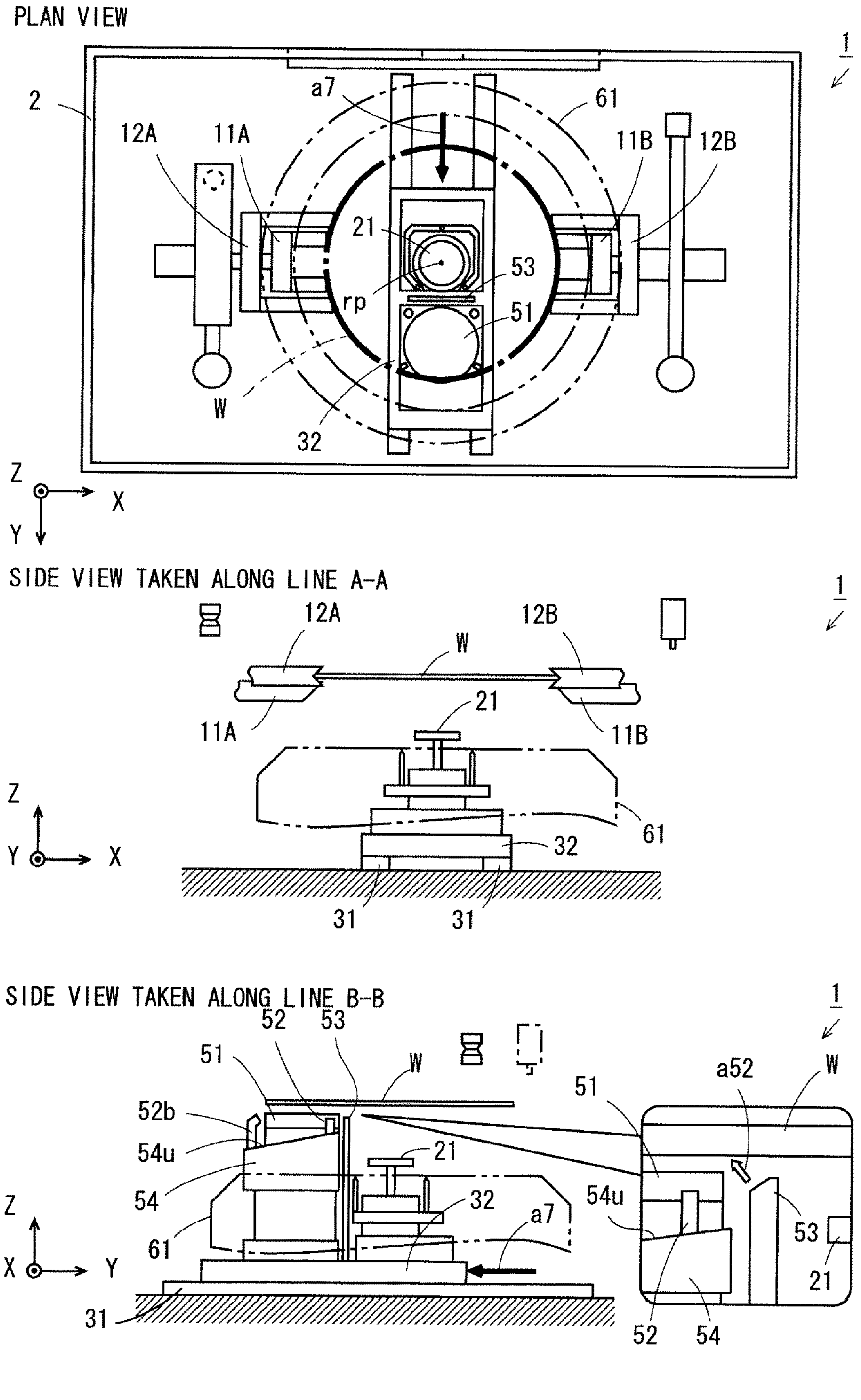
FIG. 12 is a schematic diagram for explaining the schematic operation of the substrate cleaning device of FIG. 3.
Figure 19:
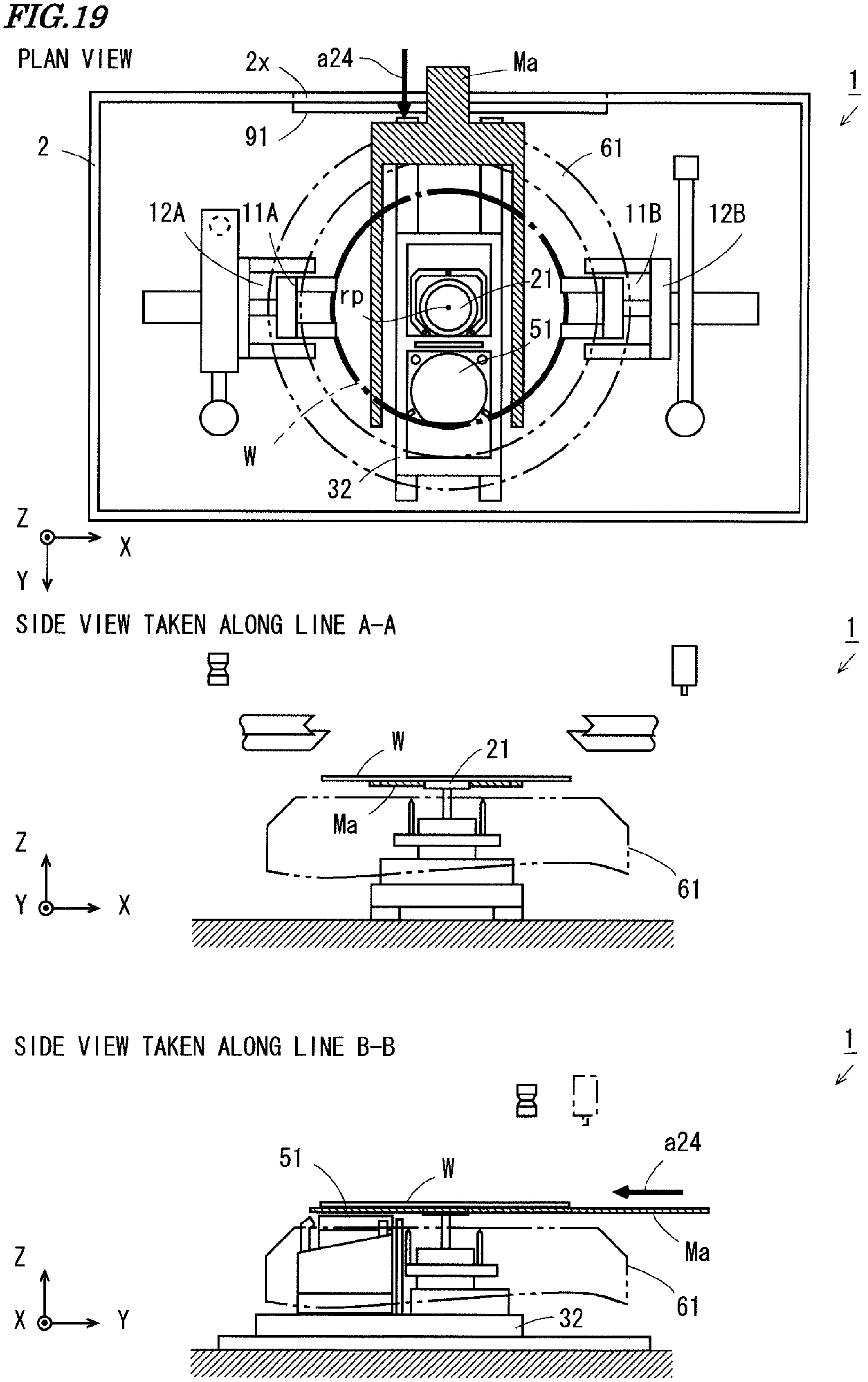
FIG. 19 is a schematic diagram for explaining the schematic operation of the substrate cleaning device of FIG. 3.

Thereafter, as indicated by the thick solid arrow a7 in FIG. 12, the mobile base 32 is moved rearwardly such that the center of the suction holder 21 is located at the plane reference position rp in plan view. That is, the mobile base 32 is moved from the second horizontal position to the first horizontal position. At this time, injection of gas from the gas injector 53 to the substrate W continues, so that the lower-surface center region of the substrate W is sequentially dried by a gas curtain.

Next, as indicated by the thick solid arrow a8 in FIG. 13, the lifting-lowering supporter 54 is lowered such that the cleaning surface of the lower-surface brush 51 is located farther downwardly than the suction surface (upper end portion) of the suction holder 21. Thus, the lower-surface brush 51 is moved to the waiting position. Further, as indicated by the thick solid arrows a9 in FIG. 13, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B (being placed). After cleaning of the lower-surface center region of the substrate W and before drying by the gas injector 53, the lower-surface brush 51 may be moved from the first processing position to the waiting position.

Thereafter, as indicated by the thick solid arrow a10 in FIG. 13, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Next, as indicated by the thick solid arrows a11 in FIG. 14, the lower chucks 11A, 11B are moved away from each other. At this time, the lower chucks 11A, 11B move to positions at which the lower chucks 11A, 11B do not overlap with the substrate W supported by the plurality of support pins 41 in plan view. Thus, both of the upper holding devices 10A, 10B return to the initial state.

Next, as indicated by the thick solid arrow a12 in FIG. 15, the pin coupling member 42 is lowered such that the upper end portions of the plurality of support pins 41 are located farther downwardly than the suction holder 21. Thus, the substrate W supported on the plurality of support pins 41 is received by the suction holder 21. In this state, the suction holder 21 holds the lower-surface center region of the substrate W by suction. At the same time as the pin coupling member 42 is lowered or after the pin coupling member 42 is lowered, the cup 61 is lifted from the lower cup position to the upper cup position as indicated by the thick solid arrow a13 in FIG. 15.

Next, as indicated by the thick solid arrow a14 in FIG. 16, the suction holder 21 is rotated about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 16, the spray nozzle 73 is moved to a position above the substrate W. Further, the spray nozzle 73 is lowered such that the distance between the spray nozzle 73 and the substrate W is a predetermined distance. In this state, the spray nozzle 73 injects the fluid mixture of the cleaning liquid and gas to the upper surface of the substrate W. Further, the rotation support shaft 71 is rotated. Thus, as indicated by the thick solid arrow a16 in FIG. 16, the spray nozzle 73 is moved at a position above the rotating substrate W. The fluid mixture is injected to the entire upper surface of the substrate W, so that the entire upper surface of the substrate W is cleaned.

When the upper surface of the substrate W is cleaned by the spray nozzle 73, the rotation support shaft 81 of the end-portion cleaning device 80 is rotated and lowered. Thus, as indicated by the thick solid arrow a17 in FIG. 16, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are washed away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 comes into contact with the lower-surface outer region of the substrate W. The position of the lower-surface brush 51 coming into contact with the lower surface of the substrate W with the substrate W held by the lower holding device 20 is referred to as a second processing position. Further, as indicated by the thick solid arrow a18 in FIG. 16, the lower-surface brush 51 is rotated (spins) about the axis extending in the up-and-down direction. Further, the substrate nozzles 52 discharge the cleaning liquid toward the lower surface of the substrate W, and the gas injector 53 injects the gas toward the lower surface of the substrate W. Thus, it is possible to clean the entire lower-surface outer region of the substrate W held by suction and rotated by the suction holder 21 using the lower-surface brush 51. The rotation direction of the lower-surface brush 51 may be opposite to the rotation direction of the suction holder 21. In this case, the lower-surface outer region of the substrate W can be cleaned efficiently.

The lifting-lowering supporter 54 may be configured to be movable in the Y direction relative to the lower holding device 20 on the mobile base 32. In this case, as indicated by the thick solid arrow a19 in FIG. 16, the lifting-lowering supporter 54 is moved in the Y direction on the mobile base 32. Thus, the entire lower-surface outer region of the substrate W can be cleaned by the lower-surface brush 51 regardless of the size of the lower-surface brush 51.

When cleaning of the upper surface, the outer peripheral end and the lower-surface outer region of the substrate W is completed, injection of the fluid mixture from the spray nozzle 73 to the substrate W is stopped. Further, as indicated by the thick solid arrow a20 in FIG. 17, the spray nozzle 73 is moved to a position near one side of the cup 61 (the position in the initial state). Further, as indicated by the thick solid arrow a21 in FIG. 17, the bevel brush 83 is moved to a position near the other side of the cup 61 (the position in the initial state). Further, the lifting-lowering supporter 54 is lowered such that the cleaning surface of the lower-surface brush 51 is spaced apart from the substrate W by a predetermined distance. Thus, the lower-surface brush 51 moves from the second processing position to the waiting position. Further, discharging of the cleaning liquid from the substrate nozzles 52 to the substrate W and injection of gas from the gas injector 53 to the substrate W are stopped. In this state, the suction holder 21 is rotated at a high speed, so that the cleaning liquid adhering to the substrate W is shaken off, and the entire substrate W is dried.

Next, as indicated by the thick solid arrow a22 in FIG. 18, the cup 61 is lowered from the upper cup position to the lower cup position. Further, as indicated by the thick solid arrows a23 in FIG. 18, the lower chucks 11A, 11B are moved close to each other to the positions at which the lower chucks 11A, 11B can support a new substrate W in preparation for the new substrate W to be carried into the unit casing 2.

Finally, the substrate W is carried out from the unit casing 2 of the substrate cleaning device 1. Specifically, the shutter 91 opens the inlet-outlet port 2*x* immediately before the substrate W is carried out. Thereafter, as indicated by the thick solid arrow a24 in FIG. 19, the hand Ma of the main robot 300 of FIG. 1 enters the unit casing 2 through the inlet-outlet port 2*x*. Subsequently, the hand Ma receives the substrate W on the suction holder 21 and exits from the inlet-outlet port 2*x*. After the hand Ma exits, the shutter 91 closes the inlet-outlet port 2*x*.

In the following description, an operation of carrying the substrate W out from one substrate cleaning device 1 performed by the main robot 300 of FIG. 1 is referred to as a carry-out operation. The carry-out operation includes advancement and retreat of the hand Ma with at least part of the hand Ma in the unit casing 2. Therefore, in the present embodiment, a period during which the carry-out operation is performed by the main robot 300 includes a period during which the substrate W is carried out from one substrate cleaning device 1 and any one of the hands of the main robot 300 is in the unit casing 2.

5. Discharge of Cleaning Liquid from Brush Nozzles 52*a*, 52*b* to Lower-surface Brush 51

(a) Cleaning for Lower-Surface Brush 51

In the substrate cleaning device 1, the cleaning liquid is discharged from the brush nozzles 52*a*, 52*b* to the rotating lower-surface brush 51. In this case, the cleaning liquid is supplied to the entire lower-surface brush 51, and contaminants adhering to the lower-surface brush 51 are washed away. Thus, the substrate W is prevented from being cleaned by the lower-surface brush 51 with lower cleanliness. Further, it prevents the lower-surface brush 51 from being dried and prevents a defect (damage) caused by contact of the dried lower-surface brush 51 with the substrate W.

A period of time required for cleaning of the lower-surface outer region of the substrate W by the relatively large lower-surface brush 51 (FIG. 16) is shorter than a period of time required for cleaning of the upper surface of the substrate W with use of the spray nozzle 73 (FIG. 16). As such, in the present embodiment, the lower-surface brush 51 reciprocates between the cleaning position and the waiting position multiple times during cleaning of the upper surface of the substrate W by the spray nozzle 73. Further, when the lower-surface brush 51 is located at the waiting position, the cleaning liquid is discharged from the brush nozzles 52*a*, 52*b* to the lower-surface brush 51. Thus, the lower-surface outer region of the substrate W and the lower-surface brush 51 are alternately cleaned. In this case, as compared to a case in which the lower-surface outer region of the substrate W is cleaned continuously during cleaning of the upper surface of the substrate W by the spray nozzle 73, the cleanliness of the lower-surface outer region of the substrate W after cleaning is improved.

(b) Period not Preferred for Cleaning of Lower-Surface Brush 51

As described above, the lower-surface brush 51 is preferably not dried when coming into contact with the substrate W. Therefore, the cleaning liquid is preferably discharged from the brush nozzles 52*a*, 52*b* to the lower-surface brush 51 not only when the upper surface of the substrate W is cleaned with use of the spray nozzle 73.

However, when the cleaning liquid discharged from the brush nozzles 52*a*, 52*b* is splashed from the lower-surface brush 51, the splashes may adhere to the substrate W or the peripheral member of the substrate W at an unintended time. In this case, due to the cleaning for the lower-surface brush 51, the cleanliness of the substrate W after the cleaning processing is degraded or the cleanliness of the environment for cleaning the substrate W is degraded. The cleanliness of the environment for cleaning the substrate W means the cleanliness of each constituent element provided in the unit casing 2 and the cleanliness of the device that transports the substrate W.

As such, in the present embodiment, in part of a period during which the series of above-mentioned operations are performed to clean one substrate W, the part of a period hereinafter being referred to as a basic stop period, the lower-surface cleaning controller 9E of FIG. 7 prohibits supply of the cleaning liquid from the brush cleaning liquid supplier 57 to the brush nozzles 52*a*, 52*b* and does not clean the lower-surface brush 51.

On the other hand, in at least part of a period during which the series of above-mentioned operations are performed to clean one substrate W, the part of a period hereinafter being referred to as a cleaning allowable period, the lower-surface cleaning controller 9E of FIG. 7 allows supply of the leasing liquid from the brush cleaning liquid supplier 57 to the brush nozzles 52*a*, 52*b*.

FIG. 20 is a diagram showing the relationship between a series of operations of the substrate cleaning device 1 when the cleaning processing is preformed on one substrate W and whether the cleaning liquid can be supplied from the brush cleaning liquid supplier 57 to the brush nozzles 52*a*, 52*b*.

FIG. 20 is a diagram showing the relationship between a series of operations of the substrate cleaning device 1 when the cleaning processing is performed on one substrate W and whether the cleaning liquid can be supplied from the brush cleaning liquid supplier 57 to the brush nozzles 52*a*, 52*b*. In FIG. 20, a plurality of operation states of the substrate cleaning device 1 are shown in a chronological order, and whether the supply of the cleaning liquid for cleaning a brush is allowed in each operation state is (c) Carry-In Period and Carry-Out Period o Substrate W In the present embodiment, the basic stop period includes a carry-in period of the substrate W and a carry-out period of the substrate W. As shown in FIG. 20, in the present embodiment, the lower-surface cleaning controller 9E of FIG. 7 stops the supply of the cleaning liquid from the brush cleaning liquid supplier 57 to the brush nozzles 52*a*, 52*b* during the carry-in period and the carry-out period of the substrate W with respect to the substrate cleaning device 1. The carry-in period of the substrate W is a period during which the carry-in operation of the substrate W is performed by the main robot 300. The carry-out period of the substrate W is a period during which the carry-out operation of the substrate W is performed by the main robot 300. Thus, during the carry-in operation and the carry-out operation of the substrate W by the main robot 300, the cleaning liquid for cleaning a brush is not splashed in the unit casing 2. Therefore, during the carry-in operation and the carry-out operation of the substrate W, the cleaning liquid for cleaning a brush does not adhere to the substrate W transported by the main robot 300. Further, the cleaning liquid for cleaning a brush does not adhere to the hand Ma of the main robot 300 entering the unit casing 2. Therefore, degradation in cleanliness of the substrate W and degradation in cleanliness of the hand Ma of the main robot 300 due to the cleaning for the lower-surface brush 51 are reduced.

(d) Reception-Transfer Period of Substrate W Between Upper and Lower Holding Devices (10A, 10B, 20)

In the present embodiment, the basic stop period includes a period during which the substrate W is received and transferred between the upper and lower holding devices (10A, 10B, 20).

When the substrate W is received and transferred between the upper holding devices 10A, 10B and the lower holding device 20, the lower-surface cleaning controller 9E of FIG. 7 stops the supply of the cleaning liquid from the brush cleaning liquid supplier 57 to the brush nozzles 52*a*, 52*b*.

Specifically, in the present embodiment, the plurality of support pins 41 are lifted and lowered for the switch from a state where the substrate W is held by the upper holding devices 10A, 10B to a state where the substrate W is held by the lower holding device 20.

As such, the lower-surface cleaning controller 9E stops the supply of the cleaning liquid for cleaning a brush during the lifting-lowering operation of the plurality of support pins 41. Thus, during the lifting-lowering operation for the plurality of support pins 41, the cleaning liquid for cleaning a brush is not splashed in the unit casing 2 during the lifting operation of the plurality of support pins 41. Therefore, when the substrate W is received and transferred between the upper holding devices 10A, 10B and the lower holding device 20, the cleaning liquid for cleaning a brush does not adhere to the substrate W or the peripheral members of the substrate W (the plurality of support pins 41, the pin coupling member 42, etc.) Therefore, degradation in cleanliness of the substrate W and degradation in cleanliness of the receiving-transferring device 40 due to the cleaning for the lower-surface brush 51 are reduced.

(e) Periods During and after Drying for Substrate W Held by Lower Holding Device 20

Further, in the present embodiment, the basic stop period includes periods during and after drying for the substrate W held by the lower holding device 20.

With the substrate W held by the lower holding device 20, the lower-surface cleaning controller 9E of FIG. 7 stops the supply of the cleaning liquid from the brush cleaning liquid supplier 57 to the brush nozzles 52*a*, 52*b* when the substrate W is dried after cleaning. Further, in a period during which the dried substrate W is held by the lower holding device 20, the lower-surface cleaning controller 9E stops the supply of the cleaning liquid from the brush cleaning liquid supplier 57 to the brush nozzles 52*a*, 52*b*.

Specifically, in a series of processing for one substrate W, it is assumed that cleaning for the upper surface, the outer peripheral end and the lower-surface outer region of the substrate W held by suction by the suction holder 21 is completed. In this case, after the cleaning is completed, with the cleaning liquid or the like not supplied to the substrate W, the suction holder 21 is rotated at a high speed, and the substrate W is dried (spin drying). As such, the lower-surface cleaning controller 9E stops the supply of the cleaning liquid for cleaning a brush in a period from a point in time at which spin drying for the substrate W is started until the time when the substrate W is received by the main robot 300. Thus, after the spin drying for the substrate W is started, the cleaning liquid for cleaning a brush is not splashed in the unit casing 2. Therefore, the cleaning liquid for cleaning a brush does not adhere to the dried substrate W and its peripheral members.

Therefore, degradation in cleanliness of the substrate W and degradation in cleanliness of the lower holding device 20 due to the cleaning for the lower-surface brush 51 are reduced.

(f) Cleaning Allowable Period

In the present embodiment, a cleaning allowable period includes a period during which the substrate W is not present in the unit casing 2. In the above-mentioned example, a period before the substrate W on which the cleaning processing has not been performed is carried into the substrate cleaning device 1 and a period after the substrate W on which the cleaning processing has been performed is carried out from the substrate cleaning device 1 are included. In a period during which the substrate W is not present in the unit casing 2, even when the cleaning liquid for cleaning a brush is discharged to the lower-surface brush 51, the cleaning liquid that is splashed due to the discharge does not come into contact with the substrate W. Here, in a case in which the substrate W is not present in the unit casing 2, the substrate cleaning device 1 is basically in the initial state. During the period of the initial state, the lower-surface brush 51 is held at the waiting position. The waiting position is located farther downward than the suction holder 21. Thus, in the period of the initial state, even in a case in which the cleaning liquid is discharged to the lower-surface brush 51, the cleaning liquid is less likely to adhere to the upper holding devices 10A, 10B and the suction holder 21 of the lower holding device 20.

In addition to the above-mentioned example, the cleaning allowable period includes a period from the time when the substrate W is held by the upper holding device 10A, 10B until the time when the holding state is released. Further, the cleaning allowable period includes a period during which the substrate W is cleaned after the substrate W is held by the lower holding device 20, that is, a period from the time when the substrate W is held by the lower holding device 20 until the time when the spin drying for the substrate W is started.

During the cleaning allowable period, even when the cleaning liquid for cleaning a brush is discharged, the cleanliness of the substrate W and the environment for cleaning the substrate W is basically considered to be unlikely to be degraded. Therefore, in the substrate cleaning device 1, the lower-surface brush 51 can be cleaned at any point in time during the cleaning allowable period and not limited to during the cleaning for the upper surface of the substrate W.

However, even during the cleaning allowable period, depending on the positional relationship among the respective constituent elements in the unit casing 2 and the like, the discharge of the cleaning liquid for cleaning a brush may cause degradation in cleanliness of the substrate W and the environment for cleaning the substrate W.

It is considered that, to some extent, the user knows the positional relationship among the respective constituent elements in the unit casing 2 during the processing for the substrate W in the substrate cleaning device 1 or the like. Further, it is considered that, to some extent, the user can predict the influence of the discharge of the cleaning liquid for cleaning a brush on the cleanliness of the substrate W and its peripheral members during the processing for the substrate W. In consideration of these points, in regard to the cleaning allowable period, it is preferable that the user suitably sets a point in time at which the cleaning liquid for cleaning a brush is discharged.

As such, in the present embodiment, the user can set allowing or stop of the supply of the cleaning liquid for cleaning a brush during the cleaning allowable period as an operating condition of the brush cleaning liquid supplier 57 by operating the operation panel 180 of FIG. 7. For example, the user can set allowing or stop of the supply of the cleaning liquid for cleaning a brush in a period during which the substrate W is held by the upper holding devices 10A, 10B as an operating condition of the brush cleaning liquid supplier 57.

Figure 22:
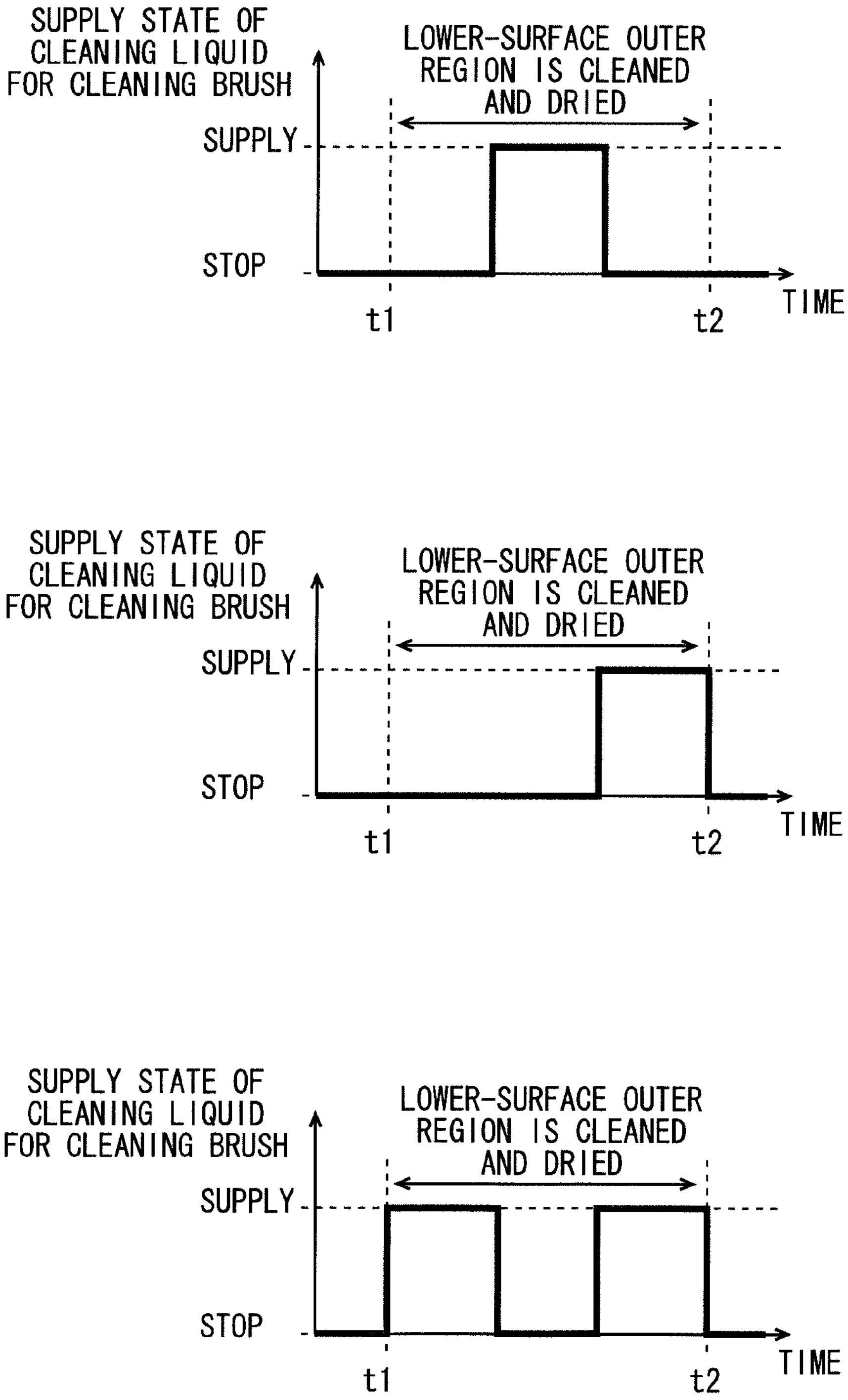
FIG. 22 is a diagram showing a setting example in regard to the supply state of the cleaning liquid for cleaning a brush in a period during which the substrate W is held by the upper holding devices.

FIGS. 21 and 22 are diagrams showing a setting example in regard to the supply state of the cleaning liquid for cleaning a brush in a period during which the substrate W is held by the upper holding devices 10A, 10B. In each of FIGS. 21 and 22, a plurality of setting examples are shown in the upper, middle and lower fields. In each of the diagrams in regard to the setting examples, the abscissa represents time. Further, cleaning for the lower-surface center region of the substrate W held by the upper holding device 10A, 10B is started at a point t1 in time, and drying for the lower-surface center region of the substrate W ends at a point t2 in time.

In the setting example in the upper field of FIG. 21, in the period from the point t1 to the point t2 in time, the cleaning liquid for cleaning a brush is continuously discharged to the lower-surface brush 51. Further, in the setting example in the middle field of FIG. 21, in the period from the point t1 to the point t2 in time, the cleaning liquid for cleaning a brush is not continuously discharged to the lower-surface brush 51.

In the setting example in the lower field of FIG. 21, in the period from the point t1 to the point t2 in time, the cleaning liquid for cleaning a brush is discharged to the lower-surface brush 51 only in an initial part of the period. In the setting example in the upper field of FIG. 22, in the period from the point t1 to the point t2 in time, the cleaning liquid for cleaning a brush is discharged to the lower-surface brush 51 only in a middle part of the period. In the setting example in the middle field of FIG. 22, in the period from the point t1 to the point t2 in time, the cleaning liquid for cleaning a brush is discharged to the lower-surface brush 51 only in a final part of the period. In the setting example in the lower field of FIG. 22, in the period from the point t1 to the point t2 in time, the cleaning liquid for cleaning a brush is discharged to the lower-surface brush 51 only in an initial part and a final part of the period.

As described above, the user can set allowing or stop of the supply of the cleaning liquid for cleaning a brush during the cleaning allowable period as an operating condition of the brush cleaning liquid supplier 57 by operating the operation panel 180 of FIG. 7. As described above, the set operating condition is received by the condition receiver 9J of FIG. 7 and stored in the control device 170. The lower-surface cleaning controller 9E of FIG. 7 controls the brush cleaning liquid supplier 57 based on the set operating condition.

6. Effects (a) In the above-mentioned substrate cleaning device 1, the substrate W that is carried into the unit casing 2 by the main robot 300 is held by the upper holding devices 10A, 10B or the lower holding device 20. The lower-surface brush 51 comes into contact with the substrate W held by the upper holding device 10A, 10B or the lower holding device 20, whereby the lower surface of the substrate W is cleaned. The lower-surface brush 51 is cleaned by the cleaning liquid discharged from the brush nozzles 52*a*, 52*b*. Thus, the substrate W is prevented from being cleaned by the lower-surface brush 51 with lower cleanliness, and degradation in cleanliness of the cleaned substrate W is reduced.

Further, with the above-mentioned substrate cleaning device 1, in the carry-in period and the carry-out period of the substrate W, the cleaning liquid is not discharged to the lower-surface brush 51, and the cleaning liquid is not splashed in the vicinity of the substrate W. Therefore, in the carry-in period and the carry-out period of the substrate W, the cleaning liquid for cleaning a brush does not adhere to the substrate W or the hands (Ma to Md) of the main robot 300.

As a result, the substrate W is prevented from being cleaned by the lower-surface brush 51 with degraded cleanliness, and degradation in cleanliness of the substrate W and degradation in cleanliness of environment for cleaning the substrate W caused by the cleaning for the lower-surface brush 51 are reduced.

(b) With the above-mentioned substrate cleaning device 1, in a period during which the substrate W is received and transferred between the upper holding devices 10A, 10B and the lower holding device 20, that is, a period during which the lifting-lowering operation for the substrate W is performed by the receiving-transferring device 40, the cleaning liquid for cleaning a brush is not discharged to the lower-surface brush 51, and the cleaning liquid is not splashed in the vicinity of the substrate W. In a period during which the substrate W is received and transferred between the upper holding devices 10A, 10B and the lower holding device 20, the cleaning liquid for cleaning a brush does not adhere to the substrate W, the plurality of support pins 41 or the pin coupling member 42. As a result, the substrate W is prevented from being cleaned by the lower-surface brush 51 with degraded cleanliness, and degradation in cleanliness of the substrate W and degradation in cleanliness of the environment for cleaning the substrate W caused by the cleaning for the lower-surface brush 51 are reduced.

(c) With the above-mentioned substrate cleaning device 1, in a period during and after the substrate W held by the lower holding device 20 is dried, the cleaning liquid for cleaning a brush is not discharged to the lower-surface brush 51, and the cleaning liquid is not splashed in the vicinity of the substrate W. Thus, after a point in time at which drying for the substrate W held by the lower holding device 20 is started, the cleaning liquid for cleaning a brush does not adhere to the substrate W or the lower holding device 20. As a result, the substrate W is prevented from being cleaned by the lower-surface brush 51 with degraded cleanliness, and degradation in cleanliness of the substrate W and degradation in cleanliness of the environment for cleaning the substrate W caused by the cleaning for the lower-surface brush 51 are reduced.

(d) As described above, in the cleaning allowable period, depending on the state of processing for the substrate W in the substrate cleaning device 1, even when the cleaning liquid discharged to the lower-surface brush 51 adheres to the substrate W, the adhesion may not influence the cleanliness of the substrate W after cleaning. Further, depending on the position of the lower-surface brush 51 relative to the substrate W, the cleaning liquid discharged to the lower-surface brush 51 may not be splashed to the position of the substrate W and its peripheral members. Further, the influence of the cleaning liquid discharged to the lower-surface brush 51 on the substrate W during the cleaning allowable period and its peripheral members can be predicted to some extent.

With the above-mentioned substrate cleaning device 1, the user can input and set an operating condition of the brush cleaning liquid supplier 57 during the cleaning allowable period by operating the operation panel 180. Thus, in accordance with a set operating condition of the brush cleaning liquid supplier 57, the supply state of the cleaning liquid to the lower-surface brush 51 is adjusted. For example, by setting a desired operating condition, in the period during which the substrate W is cleaned after the substrate W is held by the upper holding devices 10A, 10B, the user can stop the discharge of the cleaning liquid for a point in time at which the discharge of the cleaning liquid is considered to adversely influence the cleanliness of the substrate W. As a result, the substrate W is prevented from being cleaned by the lower-surface brush 51 with degraded cleanliness, and degradation in cleanliness of the substrate W and degradation in cleanliness of the environment for cleaning the substrate W caused by the cleaning for the lower-surface brush 51 are reduced.

7. Other Embodiments (a) While the cleaning allowable period includes a period from the time when the substrate W is held by the upper holding devices 10A, 10B until the time when its holding state is released in the substrate cleaning device 1 according to the above-mentioned embodiment, the present disclosure is not limited to this.

Even when the cleaning liquid for cleaning a brush is discharged to the lower-surface brush 51 with the lower-surface brush 51 located at the waiting position, its splashes are unlikely to reach the upper holding devices 10A, 10B and their peripheral portions. In contrast, in a case in which the lower-surface brush 51 is at a position other than the waiting position, that is, a case in which the lower-surface brush 51 is located farther upwardly than the waiting position, for example, the distance between the lower-surface brush 51 and the upper holding devices 10A, 10B is shortened. When the cleaning liquid for cleaning a brush is discharged to the lower-surface brush 51 in this state, splashes of the cleaning liquid are likely to reach the upper holding devices 10A, 10B and their peripheral portions as compared to a case in which the lower-surface brush 51 is at the waiting position.

As such, in a period from the time when the substrate W is held by the upper holding devices 10A, 10B until the time when its holding state is released, only when the lower-surface brush 51 is at the waiting position, the supply of the cleaning liquid from the brush cleaning liquid supplier 57 to the brush nozzles 52*a*, 52*b* may be allowed. In other words, in a period during which the substrate W is held by the upper holding devices 10A, 10B, the discharge of the cleaning liquid for cleaning a brush may be allowed when the lower-surface brush 51 is at the waiting position, and the discharge of the cleaning liquid for cleaning a brush may be prohibited when the lower-surface brush 51 is at a position other than the waiting position.

In this case, by controlling the brush cleaning liquid supplier 57, the lower-surface cleaning controller 9E of FIG. 7 stops the supply of the cleaning liquid to the brush nozzles 52*a*, 52*b* when the substrate W is held by the upper holding devices 10A, 10B and the lower-surface brush 51 is at a position other than the waiting position. Thus, with the substrate W held by the upper holding devices 10A, 10B, adhesion of the cleaning liquid for cleaning a brush to the substrate W and its peripheral members is reduced. As a result, the substrate W is prevented from being cleaned by the lower-surface brush 51 with degraded cleanliness, and degradation in cleanliness of the substrate W and degradation in cleanliness of the environment for cleaning the substrate W caused by the cleaning for the lower-surface brush 51 are reduced.

(b) While the cleaning allowable period includes a period during which the substrate W is not present in the unit casing 2 in the substrate cleaning device 1 according to the above-mentioned embodiment, the present disclosure is not limited to this.

As described above, in a case in which the substrate W is not present in the unit casing 2, the substrate cleaning device 1 is basically in the initial state (waiting state), and the lower-surface brush 51 is held at the waiting position. However, even in a case in which the substrate W is not present in the unit casing 2, the lower-surface brush 51 may be moved to a position other than the waiting position due to repair, failure or the like of the substrate cleaning device 1. As such, in a period during which the substrate W is not present in the unit casing 2, the supply of the cleaning liquid from the brush cleaning liquid supplier 57 to the brush nozzles 52*a*, 52*b* may be allowed only when the lower-surface brush 51 is at the waiting position. In other words, in a period during which the substrate W is not present in the unit casing 2, the discharge of the cleaning liquid for cleaning a brush may be allowed when the lower-surface brush 51 is at the waiting position, and the discharge of the cleaning liquid for cleaning a brush may be prohibited when the lower-surface brush 51 is at a position other than the waiting position.

In this case, by controlling the brush cleaning liquid supplier 57, the lower-surface cleaning controller 9E of FIG. 7 stops the supply of the cleaning liquid to the brush nozzles 52*a*, 52*b* when the substrate W is not present in the unit casing 2 and the lower-surface brush 51 is at a position other than the waiting position. Thus, when the user work in the unit casing 2 due to repair, failure or the like of the substrate cleaning device 1, degradation in work efficiency and degradation in cleanliness in the unit casing 2 due to the discharge of the cleaning liquid for cleaning a brush at an unintended position are prevented.

(c) In the substrate cleaning device 1 according to the above-mentioned embodiment, the receiving-transferring device 40 is provided to switch between a state in which the substrate W is held by the upper holding devices 10A, 10B and a state in which the substrate W is held by the lower holding device 20. The receiving-transferring device 40 lifts and lowers the plurality of support pins 41 to move the substrate W in the up-and-down direction relative to the upper holding devices 10A, 10B and the lower holding device 20 and to receive and transfer the substrate W. The present disclosure is not limited to the above-mentioned example.

The substrate cleaning device 1 may be provided with a lifting-lowering driver that lifts and lowers the lower holding device 20 relative to the upper holding devices 10A, 10B. Alternatively, the substrate cleaning device 1 may be provided with a lifting-lowering driver that lifts and lowers the upper holding devices 10A, 10B relative to the lower holding device 20. In this case, the lifting-lowering driver functions as a relative mover. Thus, when at least one of the lower holding device 20 and the upper holding devices 10A, 10B performs a lifting-lowering operation relative to the other one of the lower holding device 20 and the upper holding devices 10A, 10B, it is possible to receive and transfer the substrate W between the two holding devices without using the plurality of support pins 41. In this case, the receiving-transferring device 40 is not necessary.

(d) While the lower-surface outer region of the substrate W and the lower-surface brush 51 are alternately cleaned mainly during cleaning for the upper surface of the substrate W in the above-mentioned embodiment, the present disclosure is not limited to this. In a period during which the substrate W is held by the lower holding device 20, the lower-surface cleaning controller 9E may prohibit the supply of the cleaning liquid from the brush cleaning liquid supplier 57 to the brush nozzles 52*a*, 52*b*. In this case, the lower-surface cleaning controller 9E allows the supply of the cleaning liquid from the brush cleaning liquid supplier 57 to the brush nozzles 52*a*, 52*b* in the cleaning allowable period and a period during which the substrate W is not held by the lower holding device 20.

(e) While the basic stop period includes the carry-in period of the substrate W, the carry-out period of the substrate W, a period during which the substrate W is received and transferred between the two holding devices and a period after the drying of the substrate W held by the lower holding device 20 is started in the above-mentioned embodiment, the present disclosure is not limited to this. The basic stop period set in the substrate cleaning device 1 may include at least one of the carry-in period of the substrate W, the carry-out period of the substrate W, a period during which the substrate W is received and transferred between the two holding devices and a period after the drying of the substrate W held by the lower holding device 20.

(f) While the cleaning liquid supplied to the two substrate nozzles 52 and the cleaning liquid supplied to the two brush nozzles 52*a*, 52*b* are the same in the above-mentioned embodiment, these cleaning liquids may be different from each other. That is, the cleaning liquid for cleaning a substrate and the cleaning liquid for cleaning a brush may be the same or different from each other.

(g) As shown in the above-mentioned embodiment, in a case in which the cleaning liquid for cleaning a substrate and the cleaning liquid for cleaning a brush are the same, the two substrate nozzles 52 do not have to be provided. In this case, during cleaning for the lower-surface center region of the substrate W and during cleaning for the lower-surface outer region of the substrate W, the cleaning liquid discharged from the brush nozzles 52*a*, 52*b* to the lower-surface brush 51 can be used as the cleaning liquid for cleaning the substrate.

(h) While the cleaning liquid is supplied from the two substrate nozzles 52 to the substrate W during cleaning of the lower-surface center region of the substrate W by the lower-surface brush 51 in the substrate cleaning device 1 according to the above-mentioned embodiment, the present disclosure is not limited to this.

In the substrate cleaning device 1, before the lower-surface center region of the substrate W is cleaned by the lower-surface brush 51, the lower-surface brush 51 may be cleaned in advance to be impregnated with the cleaning liquid. In this case, by bringing the lower-surface brush 51 impregnated with the cleaning liquid into contact with the lower-surface center region of the substrate W, it is possible to clean the lower-surface center region of the substrate W without supply of a new cleaning liquid.

(i) The substrate cleaning device 1 according to the above-mentioned embodiment may have a back rinse nozzle that supplies a rinse liquid to the lower-surface outer region of the substrate W held by suction by the lower holding device 20.

(j) While the lower-surface outer region of the substrate W held by the lower holding device 20 is cleaned after the lower-surface center region of the substrate W held by the upper holding devices 10A, 10B is cleaned in the above-mentioned embodiment, the embodiment is not limited to this. The lower-surface center region of the substrate W may be cleaned in the upper holding devices 10A, 10B after the lower-surface outer region of the substrate W is cleaned in the lower holding device 20.

(k) While the lower-surface center region of the substrate W is cleaned in the upper holding devices 10A, 10B and the lower-surface outer region of the substrate W is cleaned in the lower holding device 20 in the above-mentioned embodiment, the embodiment is not limited to this. In the substrate cleaning device 1, the cleaning processing may be performed on the substrate W held by the upper holding devices 10A, 10B or the lower holding device 20. Therefore, the substrate W held by the other holding device which is the upper holding devices 10A, 10B or the lower holding device 20 may be subjected to processing (polishing processing, developing processing or the like) other than the cleaning processing.

(l) While the upper surface of the substrate W is cleaned with use of the spray nozzle 73 in the above-mentioned embodiment, the embodiment is not limited to this. The upper surface of the substrate W may be cleaned with use of a brush or may be cleaned with use of a rinse nozzle that discharges a rinse liquid. Further, the upper surface of the substrate W does not have to be cleaned. In this case, the substrate cleaning device 1 does not include the upper-surface cleaning device 70. Similarly, the outer peripheral end of the substrate W does not have to be cleaned. In this case, the substrate cleaning device 1 does not include the end-portion cleaning device 80.

(m) While the lower-surface outer region of the substrate W is cleaned multiple times at the processing position and the lower-surface brush 51 is cleaned multiple times at the waiting position in the above-mentioned embodiment, the embodiment is not limited to this. The cleaning of the lower-surface outer region of the substrate W at the processing position or the cleaning of the lower-surface brush 51 at the waiting position does not have to be repeated.

8. Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained. As each of various elements recited in the claims, various other elements having configurations or functions described in the claims can be also used.

In the above-mentioned embodiment, the substrate processing device 100 and the substrate cleaning device 1 are examples of a substrate cleaning device, the unit casing 2 is an example of a processing chamber, the main robot 300 is an example of a transport device, the upper holding devices 10A, 10A are examples of a first substrate holder or a second substrate holder, the lower-surface brush 51 is an example of a brush, and the lower-surface cleaning device 50 is an example of a brush cleaner.

Further, the brush nozzles 52*a*, 52*b* that discharge a cleaning liquid for cleaning a brush is an example of a cleaning nozzle, the brush cleaning liquid supplier 57 is an example of a cleaning liquid supplier, the control device 170 and the lower-surface cleaning controller 9E are examples of a controller, each of the hands Ma to Md of the main robot 300 is an example of a transport holder, the transport driver 320 is an example of a transport driver, and the lifting-lowering supporter 54 is an example of a brush mover.

Further, the lower holding device 20 is an example of a second substrate holder or a first substrate holder, the lower-surface cleaning device 50, the upper-surface cleaning device 70 and the end-portion cleaning device 80 are examples of a processor, the receiving-transferring device 40 is an example of a relative mover, the lower-surface center region of the substrate W is an example of a first region in a lower surface of a substrate, and the lower-surface outer region of the substrate W is an example of a second region in a lower surface of a substrate.

Further, the first processing position and the second processing position of the lower-surface brush 51 are examples of a cleaning position, the waiting position of the lower-surface brush 51 is an example of a waiting position, the operation panel 180 is an example of an operation unit, and the condition receiver 9J is an example of a receiver.

9. Overview of Embodiments (Item 1) A substrate processing device according to item 1 includes a processing chamber, a transport device configured to perform a carry-in operation of carrying a substrate into the processing chamber and a carry-out operation of carrying out the substrate from the processing chamber, a first substrate holder that is provided in the processing chamber and holds the substrate that has been carried in by the transport device, a brush cleaner that is provided in the processing chamber and configured to bring a brush into contact with the substrate held by the first substrate holder to clean a lower surface of the substrate, a cleaning nozzle that is provided in the processing chamber and configured to discharge a brush cleaning liquid for cleaning the brush to the brush, a cleaning liquid supplier that supplies the brush cleaning liquid to the cleaning nozzle, and a controller that stops supply of the brush cleaning liquid to the cleaning nozzle in at least part of a period during which the carry-in operation is performed by the transport device and a period during which the carry-out operation is performed by the transport device, by controlling the cleaning liquid supplier.

In the substrate processing device, the substrate that has been carried into the processing chamber by the transport device is held by the first substrate holder. The brush comes into contact with the substrate held by the first substrate holder, so that the lower surface of the substrate is cleaned. The brush is cleaned by the brush cleaning liquid discharged from the cleaning nozzle. Thus, the substrate is prevented from being cleaned by the brush with degraded cleanliness.

Further, with the above-mentioned substrate processing device, at least in part of a period in which the substrate carry-in operation is performed by the transport device and a period in which the substrate carry-out operation is performed by the transport device, the brush cleaning liquid is not supplied to the cleaning nozzle. Therefore, in a case in which the supply of the brush cleaning liquid is stopped, the brush cleaning liquid is not splashed in the vicinity of the substrate in the processing chamber. Therefore, in one of a period during which the substrate carry-in operation is performed by the transport device or a period during which the substrate carry-out operation is performed by the transport device, adhesion of the brush cleaning liquid to part of the transport device that enters the processing chamber due to the substrate carry-in operation or the substrate carry-out operation is reduced. Further, adhesion of the brush cleaning liquid to part of the substrate transported by the transport device due to the substrate carry-in operation or the substrate carry-out operation is reduced.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 2) The substrate processing device according to item 1, wherein the transport device may include a transport holder configured to be moved while holding the substrate, and a transport driver that moves the transport holder, and the controller may further cause the transport holder to enter and exit from the processing chamber from outside of the processing chamber during the carry-in operation performed by the transport device and during the carry-out operation performed by the transport device, by controlling the transport driver, and stop supply of a brush cleaning liquid from the cleaning nozzle to the brush in a period during which the transport holder is located in the processing chamber, by controlling the cleaning liquid supplier.

In this case, with the transport holder of the transport device in the processing chamber, the cleaning liquid is not discharged from the cleaning nozzle. Thus, adhesion of the brush cleaning liquid to the transport holder and the substrate being transported by the transport holder is prevented.

(Item 3) The substrate processing device according to item 1 or 2, wherein the brush cleaner may include the brush, and a brush mover configured to move the brush at a cleaning position at which the brush comes into contact with a lower surface of the substrate held by the first substrate holder and a waiting position spaced apart from the substrate held by the first substrate holder, the cleaning nozzle may be configured to discharge a brush cleaning liquid to the brush located at the waiting position, and the controller may stop supply of the brush cleaning liquid from the cleaning nozzle to the brush with the substrate not present in the processing chamber and with the brush located at a position other than the waiting position, by controlling the cleaning liquid supplier.

With the above-mentioned configuration, the supply of the brush cleaning liquid from the cleaning nozzle to the brush is stopped with the substrate not present in the processing chamber and the brush located at a position other than the waiting position. Thus, when the user work in the substrate processing device due to repair, failure or the like of the substrate processing device, degradation in work efficiency and degradation in cleanliness in the processing chamber due to the discharge of the brush cleaning liquid at an unintended position are prevented.

(Item 4) A substrate processing device according to item 4 includes a first substrate holder configured to hold a substrate, a brush cleaner configured to bring a brush into contact with the substrate held by the first substrate holder to clean a lower surface of the substrate, a second substrate holder configured to hold the substrate, a processor that performs predetermined processing on the substrate held by the second substrate holder, a relative mover that performs a relative moving operation of changing a position of the first substrate holder relative to the substrate by moving at least one of the first substrate holder, the second substrate holder and the substrate in order to switch a state in which the substrate is held by the first substrate holder to a state in which the substrate is held by the second substrate holder, a cleaning nozzle configured to discharge a brush cleaning liquid for cleaning the brush to the brush, a cleaning liquid supplier that supplies the brush cleaning liquid to the cleaning nozzle, and a controller that stops supply of the brush cleaning liquid to the cleaning nozzle during the relative moving operation performed by the relative mover, by controlling the cleaning liquid supplier.

In the substrate processing device, the substrate is held by the first substrate holder. The brush comes into contact with the substrate held by the first substrate holder, so that the lower surface of the substrate is cleaned. Further, the substrate is held by the second substrate holder. Predetermined processing is performed on the substrate held by the second substrate holder. The brush is cleaned by the brush cleaning liquid discharged from the cleaning nozzle. Thus, the substrate is prevented from being cleaned by the brush with degraded cleanliness.

Further, with the above-mentioned substrate processing device, during the relative moving operation performed by the relative mover, the brush cleaning liquid is not supplied to the cleaning nozzle. In a case in which the supply of the brush cleaning liquid is stopped, the brush cleaning liquid is not splashed in the vicinity of the substrate. Thus, when the substrate is switched from being held by the first substrate holder to being held by the second substrate holder, the brush cleaning liquid is prevented from adhering to the substrate and its peripheral members.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 5) The substrate processing device according to item 4, wherein the brush cleaner may be configured to bring the brush into contact with a first region in a lower surface of the substrate held by the first substrate holder to clean the first region, and is configured to bring the brush into contact with a second region different from the first region in the lower surface of the substrate held by the second substrate holder to clean the second region, and the controller may cause the brush cleaner to clean the first region of the lower surface of the substrate by controlling the brush cleaner with the substrate held by the first substrate holder, and may cause the brush cleaner to clean the second region of the lower surface of the substrate with the brush cleaner used as the processor by controlling the brush cleaner with the substrate held by the second substrate holder.

In this case, the first region of the lower surface of the substrate is cleaned with the substrate held by the first substrate holder, and the second region of the lower surface of the substrate is cleaned with the substrate held by the second substrate holder.

(Item 6) The substrate processing device according to item 4 or 5, may further include a processing chamber that stores the first substrate holder, the brush cleaner, the second substrate holder, the processor, the cleaning nozzle and the cleaning liquid supplier, wherein the brush cleaner may include the brush, and a brush mover configured to move the brush at a cleaning position at which the brush comes into contact with a lower surface of the substrate held by the first substrate holder and a waiting position spaced apart from the substrate held by the first substrate holder, the cleaning nozzle may be configured to discharge a brush cleaning liquid to the brush located at the waiting position, and the controller may stop supply of the brush cleaning liquid from the cleaning nozzle to the brush with the substrate not present in the processing chamber and with the brush located at a position other than the waiting position, by controlling the cleaning liquid supplier.

With the above-mentioned configuration, the supply of the brush cleaning liquid from the cleaning nozzle to the brush is stopped with the substrate not present in the processing chamber and the brush located at a position other than the waiting position. Thus, when the user work in the substrate processing device due to repair, failure or the like of the substrate processing device, degradation in work efficiency and degradation in cleanliness in the processing chamber due to the discharge of the brush cleaning liquid at an unintended position are prevented.

(Item 7) A substrate processing device according to item 7 includes a first substrate holder configured to hold a substrate, a brush cleaner configured to bring a brush into contact with the substrate held by the first substrate holder to clean a lower surface of the substrate, a cleaning nozzle configured to discharge a brush cleaning liquid for cleaning the brush to the brush, a cleaning liquid supplier that supplies the brush cleaning liquid to the cleaning nozzle, and a controller that stops supply of the brush cleaning liquid to the cleaning nozzle in at least part of a period during which the substrate is held by the first substrate holder, by controlling the cleaning liquid supplier.

In the substrate processing device, the substrate is held by the first substrate holder. The brush comes into contact with the substrate held by the first substrate holder, so that the lower surface of the substrate is cleaned. The brush is cleaned by the brush cleaning liquid discharged from the cleaning nozzle. Thus, the substrate is prevented from being cleaned by the brush with degraded cleanliness.

Further, with the above-mentioned substrate processing device, in at least part of a period during which the substrate is held by the first substrate holder, the brush cleaning liquid is not supplied to the cleaning nozzle. When the supply of the brush cleaning liquid is stopped, the brush cleaning liquid is not splashed in the vicinity of the substrate. Thus, in at least part of a period during which the substrate is held by the first substrate holder, the brush cleaning liquid is prevented from adhering to the substrate and its peripheral members.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 8) The substrate processing device according to item 7, wherein the first substrate holder may be configured to rotate the held substrate, the controller may dry the substrate by rotating the first substrate holder at a predetermined speed after the lower surface of the substrate is cleaned by the brush cleaner, by controlling the first substrate holder, and at least part of a period during which the substrate is held by the first substrate holder may include a period from a point in time at which drying of the substrate by rotation of the first substrate holder is started until a point in time at which a rotation state of the substrate by the first substrate holder is released.

In this case, the brush cleaning liquid is prevented from adhering to the substrate during drying and after drying.

(Item 9) The substrate processing device according to item 7 or 8, may further include a processing chamber that stores the first substrate holder, the brush cleaner, the cleaning nozzle and the cleaning liquid supplier, wherein the brush cleaner may include the brush, and a brush mover configured to move the brush at a cleaning position at which the brush comes into contact with a lower surface of the substrate held by the first substrate holder and a waiting position spaced apart from the substrate held by the first substrate holder, the cleaning nozzle may be configured to discharge a brush cleaning liquid to the brush located at the waiting position, and the controller may stop supply of the brush cleaning liquid from the cleaning nozzle to the brush with the substrate not present in the processing chamber and with the brush located at a position other than the waiting position, by controlling the cleaning liquid supplier.

With the above-mentioned configuration, the supply of the brush cleaning liquid from the cleaning nozzle to the brush is stopped with the substrate not present in the processing chamber and the brush located at a position other than the waiting position. Thus, when the user work in the substrate processing device due to repair, failure or the like of the substrate processing device, degradation in work efficiency and degradation in cleanliness in the processing chamber due to the discharge of the brush cleaning liquid at an unintended position are prevented.

(Item 10) A substrate processing device according to item 10 includes a first substrate holder configured to hold a substrate, a brush that comes into contact with a lower surface of the substrate to clean the lower surface, a brush mover that is configured to move the brush between a cleaning position at which the brush comes into contact with the lower surface of the substrate held by the first substrate holder and a waiting position lower than the first substrate holder and spaced apart from the substrate held by first the substrate holder, a second substrate holder that is provided at a position farther upward than the first substrate holder and configured to hold the substrate, a processor that performs predetermined processing on the substrate held by the second substrate holder, a cleaning nozzle configured to discharge a brush cleaning liquid for cleaning the brush to the brush, a cleaning liquid supplier that supplies the brush cleaning liquid to the cleaning nozzle, and a controller that stops supply of the brush cleaning liquid to the cleaning nozzle with the substrate held by the second substrate holder and with the brush located at a position other than the waiting position, by controlling the cleaning liquid supplier.

In the substrate processing device, the substrate is held by the first substrate holder. The brush comes into contact with the substrate held by the first substrate holder, so that the lower surface of the substrate is cleaned. Further, the substrate is held by the second substrate holder. Predetermined processing is performed on the substrate held by the second substrate holder. The brush is cleaned by the brush cleaning liquid discharged from the cleaning nozzle. Thus, the substrate is prevented from being cleaned by the brush with degraded cleanliness.

Further, with the above-mentioned substrate processing device, the first substrate holder is located farther upwardly than the waiting position of the brush. Further, the second substrate holder is located even farther upwardly than the first substrate holder. Therefore, with the brush is at the waiting position, even when the brush cleaning liquid is discharged to the brush, its splashes are unlikely to reach the second substrate holder and its peripheral portions.

In contrast, in a case in which the brush is at a position other than the waiting position, that is, a case in which the brush is located farther upwardly than the waiting position, for example, the distance between the brush and the second substrate holder is shortened. When the brush cleaning liquid is discharged to the brush in this state, splashes of the brush cleaning liquid are likely to reach the second substrate holder and its peripheral portions as compared to a case in which the brush is at the waiting position.

As such, in the above-mentioned substrate processing device, with the substrate held by the second substrate holder and the brush at a position other than the waiting position, the brush cleaning liquid is not supplied to the cleaning nozzle. Thus, with the substrate held by the second substrate holder, adhesion of the brush cleaning liquid to the substrate and its peripheral portions is reduced.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 11) The substrate processing device according to item 10, may further include a processing chamber that stores the first substrate holder, the brush, the brush mover, the second substrate holder, the processor, the cleaning nozzle and the cleaning liquid supplier, wherein the cleaning nozzle may be configured to discharge a brush cleaning liquid to the brush located at the waiting position, and the controller may stop supply of the brush cleaning liquid from the cleaning nozzle to the brush with the substrate not present in the processing chamber and with the brush located at a position other than the waiting position, by controlling the cleaning liquid supplier.

With the above-mentioned configuration, the supply of the brush cleaning liquid from the cleaning nozzle to the brush is stopped with the substrate not present in the processing chamber and the brush located at a position other than the waiting position. Thus, when the user work in the substrate processing device due to repair, failure or the like of the substrate processing device, degradation in work efficiency and degradation in cleanliness in the processing chamber due to the discharge of the brush cleaning liquid at an unintended position are prevented.

(Item 12) A substrate cleaning device according to item 12 includes a first substrate holder configured to be hold a substrate, a brush cleaner configured to bring a brush into contact with the substrate held by the first substrate holder to clean a lower surface of the substrate, a second substrate holder that is provided at a position farther upward than the first substrate holder and configured to hold the substrate, a processor that performs predetermined processing on the substrate held by the second substrate holder, a cleaning nozzle configured to discharge a brush cleaning liquid for cleaning the brush to the brush, a cleaning liquid supplier that supplies the brush cleaning liquid to the cleaning nozzle, and an operation unit for input of a supply condition of the brush cleaning liquid supplied by the cleaning liquid supplier in a period during which the predetermined processing is performed on the substrate by the processor, a receiver that receives the supply condition of the brush cleaning liquid input by the operation unit, and a controller that adjusts a supply state of the brush cleaning liquid supplied to the cleaning nozzle in a period during which the predetermined processing is performed on the substrate by the processor, by controlling the cleaning liquid supplier in accordance with the supply condition received by the receiver.

In the substrate processing device, the substrate is held by the first substrate holder. The brush comes into contact with the substrate held by the first substrate holder, so that the lower surface of the substrate is cleaned. Further, the substrate is held by the second substrate holder. Predetermined processing is performed on the substrate held by the second substrate holder. The brush is cleaned by the brush cleaning liquid discharged from the cleaning nozzle. Thus, the substrate is prevented from being cleaned by the brush with degraded cleanliness.

In a period during which predetermined processing is performed on the substrate held by the second substrate holder (hereinafter referred to as a predetermined processing period), depending on its processing state, even when the brush cleaning liquid discharged to the brush adheres to the substrate, the adhesion might not influence the cleanliness of the substrate. Further, depending on the position of the brush relative to the substrate, the brush cleaning liquid discharged to the brush might not be splashed to the position of the substrate and the peripheral members. Further, the influence of the brush cleaning liquid discharged to the brush in the predetermined processing period can be predicted to some extent.

With the above-mentioned substrate processing device, in consideration of the influence of the brush cleaning liquid discharged to the brush on the substrate and its peripheral members during the predetermined processing period, the user can input a supply condition for the brush cleaning liquid using the operation unit. Thus, in accordance with the supply condition of the brush cleaning liquid input by the user, the supply state of the brush cleaning liquid from the cleaning nozzle to the brush is adjusted. Further, by inputting a desired supply condition, the user can stop the discharge of the brush cleaning liquid at a point in time at which the brush cleaning liquid discharged to the brush adversely influences the cleanliness of the substrate.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 13) The substrate processing device according to item 12, may further include a processing chamber that stores the first substrate holder, the brush cleaner, the second substrate holder, the processor, the cleaning nozzle and the cleaning liquid supplier, wherein the brush cleaner may include the brush, and a brush mover configured to move the brush at a cleaning position at which the brush comes into contact with a lower surface of the substrate held by the first substrate holder and a waiting position spaced apart from the substrate held by the first substrate holder, the cleaning nozzle may be configured to discharge a brush cleaning liquid to the brush located at the waiting position, and the controller may stop supply of the brush cleaning liquid from the cleaning nozzle to the brush with the substrate not present in the processing chamber and with the brush located at a position other than the waiting position, by controlling the cleaning liquid supplier.

With the above-mentioned configuration, the supply of the brush cleaning liquid from the cleaning nozzle to the brush is stopped with the substrate not present in the processing chamber and the brush located at a position other than the waiting position. Thus, when the user work in the substrate processing device due to repair, failure or the like of the substrate processing device, degradation in work efficiency and degradation in cleanliness in the processing chamber due to the discharge of the brush cleaning liquid at an unintended position are prevented.

(Item 14) A substrate processing method according to item 14 includes using a transport device configured to perform a carry-in operation of carrying a substrate into a processing chamber and a carry-out operation of carrying out the substrate from the processing chamber to carry the substrate into the processing chamber, holding the substrate that has been carried in by the transport device with use of the first substrate holder in the processing chamber, bringing a brush into contact with the substrate held by the first substrate holder to clean a lower surface of the substrate in the processing chamber, discharging a brush cleaning liquid to the brush from a cleaning nozzle by supplying the brush cleaning liquid for cleaning the brush to the cleaning nozzle in the processing chamber, and carrying out the substrate from the processing chamber with use of the transport device, wherein the discharging a brush cleaning liquid to the brush includes stopping supply of the brush cleaning liquid to the cleaning nozzle at least part of a period during which the carry-in operation is performed by the transport device and a period during which the carry-out operation is performed by the transport device.

With the substrate processing method, the substrate that has been carried into the processing chamber by the transport device is held by the first substrate holder. The brush comes into contact with the substrate held by the first substrate holder, so that the lower surface of the substrate is cleaned. The brush is cleaned by the brush cleaning liquid discharged from the cleaning nozzle. Thus, the substrate is prevented from being cleaned by the brush with degraded cleanliness.

Further, with the above-mentioned substrate processing method, at least in part of a period in which the substrate carry-in operation is performed by the transport device and a period in which the substrate carry-out operation is performed by the transport device, the brush cleaning liquid is not supplied to the cleaning nozzle. Therefore, in a case in which the supply of the brush cleaning liquid is stopped, the brush cleaning liquid is not splashed in the vicinity of the substrate in the processing chamber. Therefore, in one of a period during which the substrate carry-in operation is performed by the transport device or a period during which the substrate carry-out operation is performed by the transport device, adhesion of the brush cleaning liquid to part of the transport device that enters the processing chamber due to the substrate carry-in operation or the substrate carry-out operation is reduced. Further, adhesion of the brush cleaning liquid to part of the substrate transported by the transport device due to the substrate carry-in operation or the substrate carry-out operation is reduced.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 15) A substrate processing method according to item 15 includes holding a substrate with use of a first substrate holder, bringing a brush into contact with the substrate held by the first substrate holder to clean a lower surface of the substrate, holding the substrate with use of a second substrate holder, performing predetermined processing on the substrate held by the second substrate holder, performing a relative moving operation of changing a position of the first substrate holder relative to the substrate by moving at least one of the first substrate holder, the second substrate holder and the substrate in order to switch a state in which the substrate is held by the first substrate holder to a state in which the substrate is held by the second substrate holder, and discharging a brush cleaning liquid to the brush from a cleaning nozzle by supplying the brush cleaning liquid for cleaning the brush to the cleaning nozzle, wherein the discharging a brush cleaning liquid to the brush includes stopping supply of the brush cleaning liquid to the cleaning nozzle during the relative moving operation.

With the substrate processing method, the substrate is held by the first substrate holder. The brush comes into contact with the substrate held by the first substrate holder, so that the lower surface of the substrate is cleaned. Further, the substrate is held by the second substrate holder. Predetermined processing is performed on the substrate held by the second substrate holder. The brush is cleaned by the brush cleaning liquid discharged from the cleaning nozzle. Thus, the substrate is prevented from being cleaned by the brush with degraded cleanliness.

Further, with the above-mentioned substrate processing method, during the relative moving operation, the brush cleaning liquid is not supplied to the cleaning nozzle. In a case in which the supply of the brush cleaning liquid is stopped, the brush cleaning liquid is not splashed in the vicinity of the substrate. Thus, when the substrate is switched from being held by the first substrate holder to being held by the second substrate holder, the brush cleaning liquid is prevented from adhering to the substrate and its peripheral members.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 16) A substrate processing method according to item 16 includes holding a substrate with use of a first substrate holder, bringing a brush into contact with the substrate held by the first substrate holder to clean a lower surface of the substrate, discharging a brush cleaning liquid to the brush from a cleaning nozzle by supplying the brush cleaning liquid for cleaning the brush to the cleaning nozzle, wherein the discharging a brush cleaning liquid to the brush includes stopping supply of the brush cleaning liquid to the cleaning nozzle in at least part of a period during which the substrate is held by the first substrate holder.

With the substrate processing method, the substrate is held by the first substrate holder. The brush comes into contact with the substrate held by the first substrate holder, so that the lower surface of the substrate is cleaned. The brush is cleaned by the brush cleaning liquid discharged from the cleaning nozzle. Thus, the substrate is prevented from being cleaned by the brush with degraded cleanliness.

Further, with the above-mentioned substrate processing method, in at least part of a period during which the substrate is held by the first substrate holder, the brush cleaning liquid is not supplied to the cleaning nozzle. When the supply of the brush cleaning liquid is stopped, the brush cleaning liquid is not splashed in the vicinity of the substrate. Thus, in at least part of a period during which the substrate is held by the first substrate holder, the brush cleaning liquid is prevented from adhering to the substrate and its peripheral members.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 17) A substrate cleaning method according to item 17 includes holding a substrate with use of a first substrate holder, moving a brush that cleans a lower surface of the substrate by coming into contact with the lower surface between a cleaning position at which the brush comes into contact with the lower surface of the substrate held by the first substrate holder and a waiting position lower than the first substrate holder and spaced apart from the substrate held by the first substrate holder, holding the substrate with use of a second substrate holder provided at a position farther upward than the first substrate holder, performing predetermined processing on the substrate held by the second substrate holder, discharging a brush cleaning liquid to the brush from a cleaning nozzle by supplying the brush cleaning liquid for cleaning the brush to the cleaning nozzle, wherein the discharging a brush cleaning liquid to the brush includes stopping supply of the brush cleaning liquid to the cleaning nozzle with the substrate held by the second substrate holder and with the brush located at a position other than the waiting position.

With the substrate processing method, the substrate is held by the first substrate holder. The brush comes into contact with the substrate held by the first substrate holder, so that the lower surface of the substrate is cleaned. Further, the substrate is held by the second substrate holder. Predetermined processing is performed on the substrate held by the second substrate holder. The brush is cleaned by the brush cleaning liquid discharged from the cleaning nozzle. Thus, the substrate is prevented from being cleaned by the brush with degraded cleanliness.

Further, with the above-mentioned substrate processing method, the first substrate holder is located farther upwardly than the waiting position of the brush. Further, the second substrate holder is located even farther upwardly than the first substrate holder. Therefore, with the brush is at the waiting position, even when the brush cleaning liquid is discharged to the brush, its splashes are unlikely to reach the second substrate holder and its peripheral portions.

In contrast, in a case in which the brush is at a position other than the waiting position, that is, a case in which the brush is located farther upwardly than the waiting position, for example, the distance between the brush and the second substrate holder is shortened. When the brush cleaning liquid is discharged to the brush in this state, splashes of the brush cleaning liquid are likely to reach the second substrate holder and its peripheral portions as compared to a case in which the brush is at the waiting position.

As such, with the above-mentioned substrate processing method, with the substrate held by the second substrate holder and the brush at a position other than the waiting position, the brush cleaning liquid is not supplied to the cleaning nozzle. Thus, with the substrate held by the second substrate holder, adhesion of the brush cleaning liquid to the substrate and its peripheral portions is reduced.

As a result, the substrate is prevented from being cleaned by the brush with degraded cleanliness, and degradation in cleanliness of the substrate and degradation in cleanliness of the environment for cleaning a substrate due to the cleaning for the brush is reduced.

(Item 18) A substrate processing method according to item 18 includes holding a substrate with use of a first substrate holder, bringing a brush into contact with the substrate held by the first substrate holder to clean a lower surface of the substrate, holding the substrate with use of a second substrate holder provided at a position farther upward than the first substrate holder, performing predetermined processing on the substrate held by the second substrate holder, discharging a brush cleaning liquid to the brush from a cleaning nozzle by supplying the brush cleaning liquid for cleaning the brush to the cleaning nozzle, and in a case in which a supply condition of the brush cleaning liquid supplied to the cleaning nozzle in a period during which the predetermined processing is performed on the substrate held by the second substrate holder is input to an operation unit, receiving the supply condition of the brush cleaning liquid input by the operation unit, wherein the discharging a brush cleaning liquid to the brush includes adjusting a supply state of the brush cleaning liquid supplied to the cleaning nozzle in a period during which the predetermined processing is performed on the substrate in accordance with the supply condition received in the receiving.

With the substrate processing method, the substrate is held by the first substrate holder. The brush comes into contact with the substrate held by the first substrate holder, so that the lower surface of the substrate is cleaned. Further, the substrate is held by the second substrate holder. Predetermined processing is performed on the substrate held by the second substrate holder. The brush is cleaned by the brush cleaning liquid discharged from the cleaning nozzle. Thus, the substrate is prevented from being cleaned by the brush with degraded cleanliness.

In a period during which predetermined processing is performed on the substrate held by the second substrate holder (hereinafter referred to as a predetermined processing period), depending on its processing state, even when the brush cleaning liquid discharged to the brush adheres to the substrate, the adhesion might not influence the cleanliness of the substrate. Further, depending on the position of the brush relative to the substrate, the brush cleaning liquid discharged to the brush might not be splashed to the position of the substrate and the peripheral members. Furthermore, the influence of the brush cleaning liquid discharged to the brush in the predetermined processing period can be predicted to some extent.

With the above-mentioned substrate processing method, in consideration of the influence of the brush cleaning liquid discharged to the brush on the substrate and its peripheral members during the predetermined processing period, the user can input a supply condition for the brush cleaning liquid using the operation unit. Thus, in accordance with the supply condition of the brush cleaning liquid input by the user, the supply state of the brush cleaning liquid from the cleaning nozzle to the brush is adjusted. Further, by inputting a desired supply condition, the user can stop the discharge of the brush cleaning liquid at a point in time at which the brush cleaning liquid discharged to the brush adversely influences the cleanliness of the substrate.

As a result, the substrate is prevented from being cleaned by the brush with degraded cleanliness, and degradation in cleanliness of the substrate and degradation in cleanliness of the environment for cleaning a substrate due to the cleaning for the brush is reduced.

With the substrate processing device according to the above-mentioned embodiment, because degradation in cleanliness of the substrate after cleaning and degradation in cleanliness of the environment for cleaning a substrate, an occurrence of a processing defect of the substrate is reduced. Therefore, the throughput yield of a product acquired by the substrate processing is improved. Thus, because wasteful substrate processing is reduced, energy is saved for the substrate processing. Further, in a case in which a chemical liquid is used for the substrate processing, it is possible to reduce wasteful use of the chemical liquid due to the improvement of the throughput yield, thereby contributing to the reduction of contamination of the global environment.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate processing device comprising:

a processing chamber;

a transport device configured to perform a carry-in operation of carrying a substrate into the processing chamber and a carry-out operation of carrying out the substrate from the processing chamber;

a first substrate holder that is provided in the processing chamber and holds the substrate that has been carried in by the transport device;

a brush cleaner that is provided in the processing chamber and configured to bring a brush into contact with the substrate held by the first substrate holder to clean a lower surface of the substrate;

a cleaning nozzle that is provided in the processing chamber and configured to discharge a brush cleaning liquid for cleaning the brush to the brush;

a cleaning liquid supplier that supplies the brush cleaning liquid to the cleaning nozzle; and a controller that stops supply of the brush cleaning liquid to the cleaning nozzle in at least part of a period during which the carry-in operation is performed by the transport device and a period during which the carry-out operation is performed by the transport device, by controlling the cleaning liquid supplier, wherein the brush cleaner includes the brush, and a brush mover configured to move the brush at a cleaning position at which the brush comes into contact with the lower surface of the substrate held by the first substrate holder and a waiting position spaced apart from the substrate held by the first substrate holder, the cleaning nozzle is configured to discharge the brush cleaning liquid to the brush located at the waiting position, and the controller allows the supply of the brush cleaning liquid to the brush with the substrate not present in the processing chamber and with the brush located at the waiting position and stops the supply of the brush cleaning liquid from the cleaning nozzle to the brush with the substrate not present in the processing chamber and with the brush located at a position other than the waiting position, by controlling the cleaning liquid supplier.

2. The substrate processing device according to claim 1, wherein the transport device includes a transport holder configured to be moved while holding the substrate, and a transport driver that moves the transport holder, and the controller further causes the transport holder to enter and exit from the processing chamber from outside of the processing chamber during the carry-in operation performed by the transport device and during the carry-out operation performed by the transport device, by controlling the transport driver, and stops supply of a brush cleaning liquid from the cleaning nozzle to the brush in a period during which the transport holder is located in the processing chamber, by controlling the cleaning liquid supplier.

* * * * *